US011891307B2

(12) United States Patent
Komatsu et al.

(10) Patent No.: US 11,891,307 B2
(45) Date of Patent: Feb. 6, 2024

(54) SILICA-BASED PARTICLE DISPERSION AND PRODUCTION METHOD THEREFOR

(71) Applicant: JGC CATALYSTS AND CHEMICALS LTD., Kawasaki (JP)

(72) Inventors: Michio Komatsu, Fukuoka (JP); Kazuhiro Nakayama, Kitakyushu (JP); Tetsuya Tanaka, Kitakyushu (JP); Yuji Tawarazako, Kitakyushu (JP); Tatsuya Mukai, Kitakyushu (JP); Yuki Miwa, Kitakyushu (JP)

(73) Assignee: JGC CATALYSTS AND CHEMICALS LTD., Kawasaki (JP)

( * ) Notice: Subject to any disclaimer, the term of this patent is extended or adjusted under 35 U.S.C. 154(b) by 540 days.

(21) Appl. No.: 17/275,970

(22) PCT Filed: Oct. 4, 2019

(86) PCT No.: PCT/JP2019/039378
§ 371 (c)(1),
(2) Date: Mar. 12, 2021

(87) PCT Pub. No.: WO2020/075654
PCT Pub. Date: Apr. 16, 2020

(65) Prior Publication Data

US 2022/0055908 A1 Feb. 24, 2022

(30) Foreign Application Priority Data

Oct. 10, 2018 (JP) ................................ 2018-192147

(51) Int. Cl.
*C01B 33/193* (2006.01)
*C09G 1/02* (2006.01)
*H01L 21/321* (2006.01)

(52) U.S. Cl.
CPC .............. *C01B 33/193* (2013.01); *C09G 1/02* (2013.01); *H01L 21/3212* (2013.01); *C01P 2004/51* (2013.01); *C01P 2004/64* (2013.01); *C01P 2006/12* (2013.01); *C01P 2006/16* (2013.01)

(58) Field of Classification Search
CPC ...... C01B 33/193; C09G 1/02; H01L 21/3212
See application file for complete search history.

(56) References Cited

U.S. PATENT DOCUMENTS 6,267,942 B1 7/2001 Mori et al.
2010/0146864 A1 * 6/2010 Nakayama ........... C09K 3/1454 51/308

FOREIGN PATENT DOCUMENTS

| | | | |
|---|---|---|---|
| JP | 2001089128 | A | 4/2001 |
| JP | 2007137972 | A | 6/2007 |
| JP | 2010024119 | A | 2/2010 |
| JP | 5127452 | B2 | 1/2013 |
| JP | 2017197693 | A | 11/2017 |

OTHER PUBLICATIONS

Dec. 24, 2019 International Search Report issued in International Patent Application No. PCT/JP2019/039378.

* cited by examiner

*Primary Examiner* — Yong L Chu
(74) *Attorney, Agent, or Firm* — Oliff PLC

(57) ABSTRACT

A silica-based particle dispersion including a silica-based particle group and a high polishing rate and high surface precision is achieved to a silica-based substrate or a NiP-plated substrate to be polished or the like. A silica-based particle dispersion containing a group including irregularly-shaped and non-irregularly-shaped silica-based particles, wherein the irregularly-shaped silica-based particles each have a plurality of small holes thereinside and a covering silica layer which covers the core, and the silica-based particle group satisfies [1]-[3]. [1] Having an average particle size ($D_1$) of 100-600 nm, and a particle size ($D_2$) of 30-300 nm in terms of specific surface area. [2] An irregular-shape degree D ($D=D_1/D_3$) represented by the average particle size ($D_1$) and a projected area-equivalent particle size ($D_3$) being in the range of 1.1-5.0. [3] When waveform separation is performed on a volume-reference particle size distribution, a multi-peak distribution in which three or more peaks are detected.

15 Claims, 2 Drawing Sheets

[FIG 1]
(A) WHEN KURTOSIS IS POSITIVE
(B) WHEN KURTOSIS IS NEGATIVE
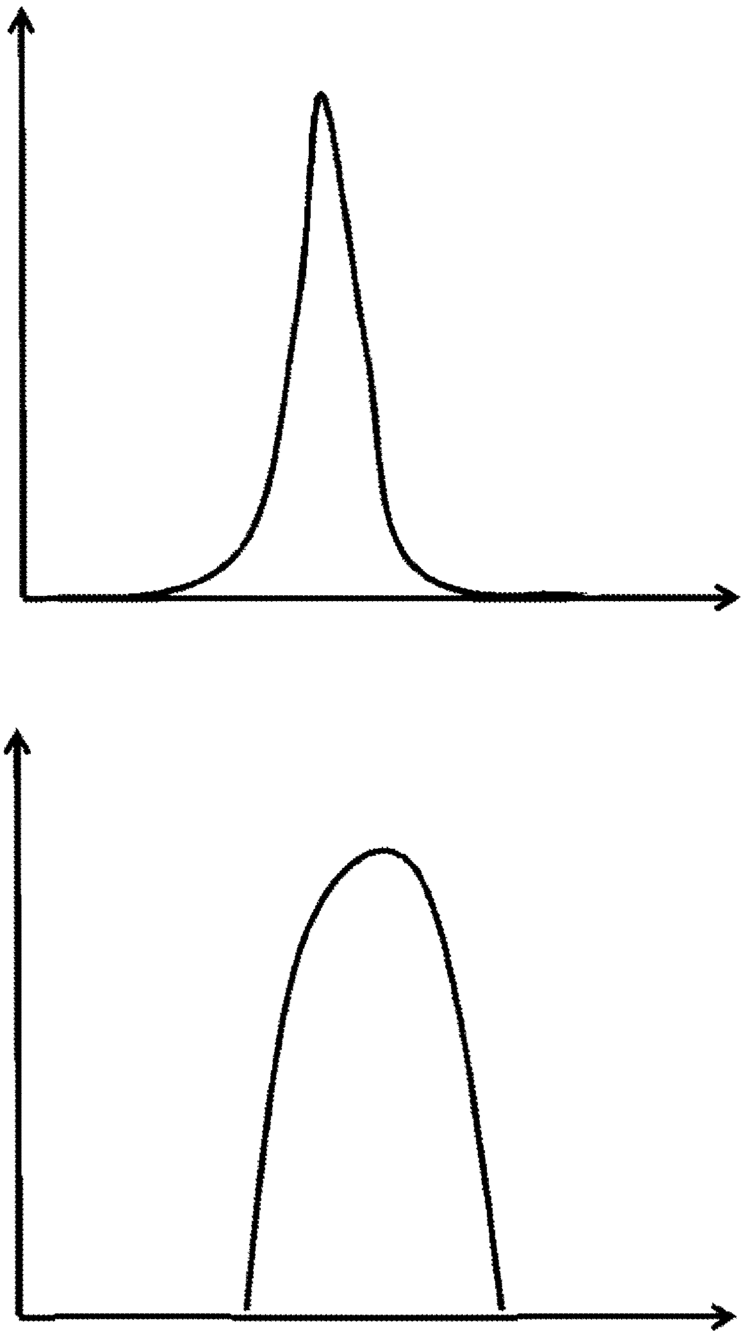

[FIG 2]
(A) WHEN SKEWNESS IS POSITIVE
(B) WHEN SKEWNESS IS NEGATIVE
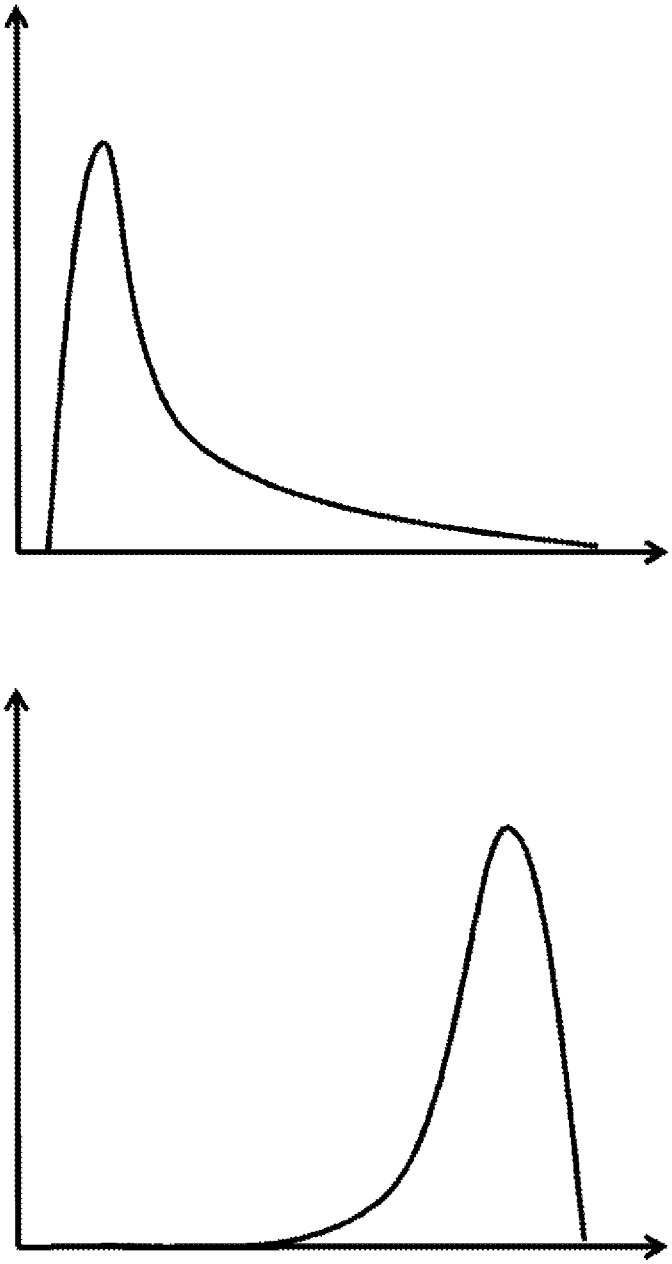

SILICA-BASED PARTICLE DISPERSION AND PRODUCTION METHOD THEREFOR

TECHNICAL FIELD

The present invention relates to a silica-based particle dispersion and the like. More specifically, the present invention relates to a silica-based particle dispersion which contains a silica-based particle group having a particle size, a particle size distribution, and a degree of shape irregularity preferable as an abrasive, and which is particularly suitable as a polishing abrasive grain dispersion for flattening an NiP-plated substrate to be polished and a silica-based substrate by means of chemical mechanical polishing (CMP) in the manufacture of magnetic disks.

BACKGROUND ART

Chemical mechanical polishing (CMP) is applied to the process of manufacturing magnetic disks and semiconductors for flattening Si wafer, glass HD and aluminum HD substrates. In the chemical mechanical polishing, a so-called polishing slurry obtained by dispersing silica or ceria abrasive grains in water and further adding chemical components to control the polishing performance is used. In particular, abrasive grains are known to have a large effect on the polishing performance, and the following performance is required as the abrasive grains: A high polishing rate can be obtained and defects such as scratches (linear scratches) do not occur at a polished surface.

It is general to use abrasive grains having a large particle size as a method of obtaining a high polishing rate. However, when the particle size of abrasive grains is too large, the number of abrasive grains per mass is reduced and the polishing rate is therefore reduced to the contrary, and furthermore, scratches are also more likely to increase. Under the circumstances, it is known that non-spherical particles, in other words, particles having an irregular shape (irregularly shaped particles) are effectively used as abrasive grains to obtain a high polishing rate without increasing the number of scratches.

Exemplary methods conventionally known for preparing a silica particle group which contains irregularly shaped silica particles having a particle size suitable for use as an abrasive include a method which involves using water glass as a material to aggregate silica particles during nucleation, and a method (PATENT DOCUMENT 1) which involves adding a silicic acid solution to irregularly shaped seed particles prepared by the above-mentioned method or another method to grow the particles to have a larger particle size.

CITATION LIST

Patent Documents

PATENT DOCUMENT 1: JP 5127452 B

SUMMARY OF THE INVENTION

Problem to be Solved by the Invention

In the irregularly shaped particles, the degree of shape irregularity (ratio between the weight-average particle size and the projected area equivalent particle size) also has a large effect on the polishing performance. More specifically, particles having a larger degree of shape irregularity are more likely to have a higher polishing rate. On the other hand, particles having a lower degree of shape irregularity are particles having a shape close to a spherical shape or an elliptical shape, and the polishing rate is therefore more likely to be lowered. However, the irregularly shaped particles have a non-spherical shape and therefore scratches usually tend to occur easily as compared with spherical or approximately spherical particles (non-irregularly shaped particles) and in particular this tendency is noticeable when the degree of shape irregularity is high.

In general, the particle size and the particle size distribution of polishing abrasive grains are known to have a large effect on the polishing performance, and abrasive grains having a larger particle size have a higher polishing rate but are more likely to reduce the surface accuracy (surface roughness, waviness, scratches and the like) of the polished substrate. On the other hand, the substrate surface can be smoothly finished with abrasive grains having a smaller particle size and scratches also do not occur easily but the polishing rate is reduced. This applies not only to spherical particles but also to irregularly shaped particles.

Irregularly shaped particles have a variety of particle size distributions. In general, particles having a comparatively large particle size usually have a higher polishing rate and irregularly shaped particles having a largest possible average particle size are therefore used when a higher polishing rate is required. However, irregularly shaped particles having a comparatively large average particle size are more likely to have a wide tail of the particle size distribution on the large particle size side, and therefore often contain a small amount of particles which are coarse as compared to the average particle size. Then, such coarse particles are more likely to cause scratches at a polished substrate or deteriorate the surface roughness and waviness of the substrate. Accordingly, irregularly shaped particles having a comparatively large average particle size and containing coarse particles and excessively large particles (these are collectively referred to as "coarse large particles") in very small amounts are desired as abrasive grains for use in polishing that requires a high polishing rate.

Further, particles having a comparatively small particle size tend to have a lower polishing rate irrespective of whether the particles are spherical particles or irregularly shaped particles, because the amount of polishing per abrasive grain is small. Particles having a comparatively small particle size easily cause abrasive grains to remain on a substrate after polishing (this is called "residual abrasive grains"). The residual abrasive grains are more likely to have difficulty in removal also in the cleaning step after polishing. This tendency is seen also in irregularly shaped particles having a comparatively large average particle size. Among the irregularly shaped particles having a comparatively large average particle size, irregularly shaped particles having such a distribution that the tail of the particle size distribution is wide on the small particle size side easily cause the residual abrasive grains.

Accordingly, abrasive grains containing comparatively large irregularly shaped particles, and abrasive grains in which the number of abrasive grains per mass is large, and which contain the smallest possible number of coarse large particles that may reduce the polishing performance and which further contain the smallest possible number of comparatively small particles that may cause the residual abrasive grains are desired in order to realize advantageous chemical mechanical polishing that achieves a high polishing rate and a high surface accuracy at the same time.

However, it has been difficult to obtain irregularly shaped silica particles having a particle size in terms of specific surface area of 100 nm or more according to the method which involves using water glass as a material to aggregate silica particles during nucleation. Further, this method had a problem in that some nuclear particles may have a runaway reaction in the silica particle aggregating step during nucleation to form coarse aggregates, which may cause scratches. According to a method in which irregularly shaped silica particles having a particle size in terms of specific surface area of 100 nm or less as obtained by the above method are used as seed particles, and a silicic acid solution is added to the seed particles to grow to a larger particle size, it has been difficult to obtain comparatively large irregularly shaped silica particles by growing the irregularly shaped seed particles while keeping their irregular shape, because the seed particles are grown to have a spherical shape or an approximately spherical shape when the particles are grown using the silicic acid solution to have the particle size in terms of specific surface area of 100 nm or more.

Further, the inventors of the present invention examined a method of obtaining irregularly shaped silica particles through pulverization of wet silica as another method of preparing a silica particle group including irregularly shaped silica particles. Consequently, although irregularly shaped silica particles were obtained, a necessary polishing rate could not be obtained when a silica particle group including irregularly shaped silica particles was used as abrasive grains, because wet silica having a gel structure did not have a sufficient particle strength to control the particle size and the particle size distribution through pulverization or crushing and the resulting irregularly shaped silica particles also had a low particle strength.

Under the circumstances, the present invention aims at providing a silica-based particle group capable of achieving a high polishing rate and a high surface accuracy when applied to polishing uses, for example, on a silica-based substrate or an NiP-plated substrate to be polished (abrasive grains containing comparatively large irregularly shaped particles, and a silica-based particle group including irregularly shaped particles having a specific particle size distribution and a necessary particle strength); a silica-based particle dispersion containing the silica-based particle group; and a method of producing the silica-based particle group.

Means for Solving the Problem

In order to solve the above-mentioned problem, the inventors of the present invention examined a method in which irregularly shaped porous silica-based gel-including particles obtained by crushing porous silica-based gel under specific conditions are used as seed particles in place of the conventional irregularly shaped seed particles obtained from water glass, and a silicic acid solution is further added to grow the seed particles. The irregularly shaped porous silica-based gel-including particles are obtained by wet crushing soft porous silica-based gel in an alkaline state. The particles hardly contain coarse large particles and their particle size is comparatively uniform. The particles substantially hold the internal pore structure of the porous silica-based gel used as the material.

By using the above-mentioned irregularly shaped porous silica-based gel-including particles as the seed particles and growing the seed particles in the presence of the silicic acid solution, silicic acid is preferentially deposited onto pores between primary particles of the seed particles (recesses between the primary particles) and the surface layer portions and the seed particles therefore have a porous internal structure, and on the other hand, silicic acid is deposited onto surface protrusions at a certain ratio in spite of a low deposition rate and the seed particles can be therefore grown while keeping their irregular shape. Because the irregularly shaped porous silica-based gel-including particles which contain a small amount of coarse large particles are used as the seed particles, the coarse large particles are preferentially crushed during crushing and the resulting silica-based particle group including irregularly shaped silica-based particles hardly contains coarse large particles. It has been found that use of the silica-based particle group as abrasive grains enables a comparatively high polishing rate, considerable suppression of occurrence of scratches at polished surfaces, and formation of polished surfaces having small surface roughness and waviness. The irregularly shaped silica-based particles which are included in the silica-based particle group that can achieve such a high polishing rate and which have a porous structure have a comparatively low density as compared to compact particles and the number of particles in the silica particle group including the irregularly shaped silica-based particles is increased. On the other hand, at the surface layer portions, neck portions between the primary particles are reinforced and the particle strength therefore exceeds a certain level. In other words, the particle strength is increased to the extent that the pressure during polishing can be withstood.

Based on the above-mentioned findings, the inventors of the present invention have completed the present invention which include: a silica-based particle group including irregularly shaped silica-based particles and non-irregularly shaped silica-based particles and having a particle size, a particle size distribution, a degree of shape irregularity, and a particle strength suitable as an abrasive; a silica-based particle dispersion containing the silica-based particle group, and a method of producing the silica-based particle group with high efficiency.

The present invention provides the following (1) to (15).

(1) A silica-based particle dispersion comprising a silica-based particle group including irregularly shaped silica-based particles and non-irregularly shaped silica-based particles, each of the irregularly shaped silica-based particles having a core including a plurality of pores in its interior and a coating silica layer covering the core, the silica-based particle group satisfying [1] to [3] described below:

[1] a weight-average particle size ($D_1$) is 100 to 600 nm, and a particle size in terms of specific surface area ($D_2$) is 30 to 300 nm;

[2] a degree of shape irregularity D ($D=D_1/D_3$) as expressed by a ratio of the weight-average particle size ($D_1$) to a projected area equivalent particle size ($D_3$) is 1.1 to 5.0; and

[3] a multi-peak distribution in which three or more separation peaks are detected is obtained by waveform separation of a volume-based particle size distribution.

(2) The silica-based particle dispersion according to (1), wherein internal pores of the core have an average pore size of 20 nm or less.

(3) The silica-based particle dispersion according to (1) or (2), wherein the coating silica layer has an average thickness of 1 to 50 nm and contains silica as its main component.

(4) The silica-based particle dispersion according to any one of (1) to (3), wherein the silica-based particle group has a skewness of −20 to 20 in the volume-based particle size distribution.

(5) The silica-based particle dispersion according to any one of (1) to (4), wherein a ratio of a volume of a maximum particle component in separation peaks obtained as a result of the waveform separation of the volume-based particle size distribution of the silica-based particle group is 75% or less.

(6) The silica-based particle dispersion according to any one of (1) to (5), wherein an aspect ratio of a small particle side component in a number-based particle size distribution obtained by SEM image analysis of the silica-based particle group is 1.05 to 5.0.

(7) The silica-based particle dispersion according to any one of (1) to (6), wherein a coefficient of variation of a particle size in the volume-based particle size distribution of the silica-based particle group is 30% or more.

(8) The silica-based particle dispersion according to any one of (1) to (7), wherein a smoothness S ($S=S_2/S_1$) in the silica-based particle group as expressed by a ratio of an area ($S_2$) of a circle equivalent to an average peripheral length according to an image analysis method to an average area ($S_1$) according to the image analysis method is 1.1 to 5.0.

(9) The silica-based particle dispersion according to any one of (1) to (8), wherein in the volume-based particle size distribution of the silica-based particle group, a ratio Q ($Q=Q_2/Q_1$) of a volume ($Q_2$) of particles having a size of 0.7 μm or more to a total volume ($Q_1$) is 1.2% or less.

(10) A polishing abrasive grain dispersion comprising the silica-based particle dispersion according to any one of (1) to (9).

(11) A silica-based particle group including irregularly shaped silica-based particles and non-irregularly shaped silica-based particles, each of the irregularly shaped silica-based particles having a core including a plurality of pores in its interior and a coating silica layer covering the core, the silica-based particle group satisfying [1] to [3] described below:

[1] a weight-average particle size ($D_1$) is 100 to 600 nm, and a particle size in terms of specific surface area ($D_2$) is 30 to 300 nm;

[2] a degree of shape irregularity D ($D=D_1/D_3$) as expressed by a ratio of the weight-average particle size ($D_1$) to a projected area equivalent particle size ($D_3$) is 1.1 to 5.0; and

[3] a multi-peak distribution in which three or more separation peaks are detected is obtained by waveform separation of a volume-based particle size distribution.

(12) A method of producing a silica-based particle group including irregularly shaped silica-based particles and non-irregularly shaped silica-based particles, the method comprising steps a to c:

(step a) a step which includes subjecting a porous silica-based gel to wet crushing in an alkaline state to obtain a solution containing irregularly shaped porous silica-based gel-including particles;

(step b) a step which includes adding a silicic acid solution to the solution containing the irregularly shaped porous silica-based gel-including particles in the alkaline state and heating the solution to cause the particles to grow with their shape remaining irregular while filling pores between primary particles in the irregularly shaped porous silica-based gel-including particles by a reaction with silicic acid contained in the silicic acid solution, thereby obtaining the irregularly shaped silica-based particles; and (step c) a step which includes concentrating the silica-based particle group including the irregularly shaped silica-based particles having grown and collecting the concentrated silica-based particle group.

(13) The method of producing the silica-based particle group including the irregularly shaped silica-based particles and the non-irregularly shaped silica-based particles according to (12), wherein in the step a, the porous silica-based gel having a specific surface area of 300 to 800 $m^2/g$ is formed into the irregularly shaped porous silica-based gel-including particles having a weight-average particle size of 80 to 550 nm; and wherein in the step b, the pores between the primary particles in the irregularly shaped porous silica-based gel-including particles are filled by the reaction with the silicic acid to adjust a specific surface area of the irregularly shaped porous silica-based gel-including particles to 100 $m^2/g$ or less, and to cause the irregularly shaped silica-based particles to grow to have a weight-average particle size of 100 to 600 nm.

(14) The method of producing the silica-based particle group including the irregularly shaped silica-based particles and the non-irregularly shaped silica-based particles according to (12) or (13), wherein in the step a, the porous silica-based gel is subjected to the wet crushing in the alkaline state of pH 8.0 to 11.5 to obtain the solution containing the irregularly shaped porous silica-based gel-including particles;

wherein in the step b, the solution containing the irregularly shaped porous silica-based gel-including particles is adjusted to an $SiO_2$ concentration of 1 to 10 mass % and heated to a temperature of 60° C. to 170° C., the silicic acid solution is continuously or intermittently added in the alkaline state of pH 9 to 12.5 to fill the pores between the primary particles in the irregularly shaped porous silica-based gel-including particles by the reaction with the silicic acid to reduce the specific surface area of the particles, while causing the particles to grow with their shape remaining irregular; and wherein in the step c, the solution containing the irregularly shaped silica-based particles having grown is concentrated and the silica-based particle group including the irregularly shaped silica-based particles is collected.

(15) The method of producing the silica-based particle group including the irregularly shaped silica-based particles and the non-irregularly shaped silica-based particles according to any one of (12) to (14), wherein in the step b, an $SiO_2$ molarity of the silicic acid solution is 0.5 to 20 moles with respect to an $SiO_2$ molarity of the solution containing the irregularly shaped porous silica-based gel-including particles.

Effect of the Invention

The silica-based particle group including the irregularly shaped silica-based particles and the non-irregularly shaped silica-based particles according to the invention has a particle size, a particle size distribution, a degree of shape irregularity, and a particle strength suitable as an abrasive. Accordingly, in cases where the silica-based particle dispersion containing the silica-based particle group is used, for example, as a polishing abrasive grain dispersion, or in cases where the polishing abrasive grain dispersion is directly used as the polishing slurry, even if an NiP-plated coating to be polished and a silica-based substrate are to be treated, polishing at a high rate is possible, abrasive grains do not catch on a base material, and a high surface accuracy (less scratching, small surface roughness (Ra) and small waviness (Wa) of the polished substrate) can be simultaneously achieved.

Because the particle surfaces are not smooth but have fine protrusions and are porous, the silica-based particle group including the irregularly shaped silica-based particles and the non-irregularly shaped silica-based particles according to the invention also has a scavenger effect with which polishing dust occurring during polishing, ionic components, oligomer components, organic substances, and the like are adsorbed. Accordingly, these components can be prevented from being redeposited onto the polished substrate, thus achieving a polished surface having less residue.

Further, in the method of producing the silica-based particle group including the irregularly shaped silica-based particles and the non-irregularly shaped silica-based particles according to the invention, particles after adjustment of the shape of the irregularly shaped porous silica-based gel are used as seed particles, whereby the seed particles can be grown to a large size with their shape remaining irregular in the step of adding the silicic acid solution, and the strength of the particles can be also increased. Consequently, the silica-based particle group including the irregularly shaped silica-based particles and the non-irregularly shaped silica-based particles and having a particle size, a particle size distribution, a degree of shape irregularity, and a particle strength suitable as an abrasive can be efficiently obtained.

BRIEF DESCRIPTION OF THE DRAWINGS

FIG. 1 is an illustration diagram of kurtosis in a particle size distribution.

FIG. 2 is an illustration diagram of skewness in a particle size distribution.

DESCRIPTION OF EMBODIMENTS

A silica-based particle group including irregularly shaped silica-based particles and non-irregularly shaped silica-based particles and a silica-based particle dispersion containing the silica-based particle group according to the present invention are specifically described. The expression "particle group" in the invention means an assembly of a large number of particles.

<Weight-Average Particle Size ($D_1$)>

The silica-based particle group of the invention has a weight-average particle size ($D_1$) of 100 to 600 nm, preferably 110 to 400 nm and most preferably 120 to 300 nm. In cases where a silica-based particle group having a weight-average particle size of 100 to 600 nm is used as abrasive grains, a high polishing rate can be obtained and scratches are less likely to occur. In cases where a silica-based particle group having a weight-average particle size of less than 100 nm is used as abrasive grains, a necessary polishing rate is not obtained easily and further small particles are more likely to remain on a polished substrate. In cases where a silica-based particle group having a weight-average particle size exceeding 600 nm is used as abrasive grains, scratches tend to occur easily. Even if the weight-average particle size is further increased, the polishing rate is often not improved because the number of abrasive grains per mass is reduced.

The weight-average particle size ($D_1$) in the invention is an average particle size determined from a weight-based particle size distribution obtained by diluting a silica-based particle dispersion to be subjected to measurement with a 0.05 mass % aqueous sodium dodecyl sulfate solution to a solids concentration of 2 mass %, injecting 0.1 ml of the diluted dispersion through a syringe into a conventionally known disc centrifuge particle size distribution meter (for example manufactured by CPS Instruments Inc. and the like) and measuring in a 8%-24% sucrose density gradient solution under a condition of 18,000 rpm. Namely, according to the invention, the weight-average particle size means the "average particle size in the weight equivalent particle size distribution."

<Particle Size in Terms of Specific Surface Area ($D_2$)>

The silica-based particle group of the invention has a particle size in terms of specific surface area ($D_2$) of 30 to 300 nm, preferably 40 to 250 nm, more preferably 50 to 200 nm, and most preferably 60 to 150 nm. In cases where a silica-based particle group having a particle size in terms of specific surface area ($D_2$) of 30 to 300 nm is used as abrasive grains, a high polishing rate can be obtained and scratches are less likely to occur. In cases where a silica-based particle group having a particle size in terms of specific surface area ($D_2$) of less than 30 nm is used as abrasive grains, a necessary polishing rate is not obtained easily, and furthermore, small particles are more likely to remain on a polished substrate. In cases where a silica-based particle group having a particle size in terms of specific surface area ($D_2$) exceeding 300 nm is used as abrasive grains, there is a tendency for scratches to occur or for a polished substrate to have a deteriorated surface roughness. Further, even if the particle size in terms of specific surface area is increased more, the polishing rate tends to be lowered to the contrary because the number of abrasive grains per mass is reduced.

The particle size in terms of specific surface area ($D_2$) in the invention means an average particle size calculated in terms of specific surface area, and is calculated from the expression $D_2=6000/(SA\times\rho)$ with the use of the specific surface area (SA: $m^2/g$) as measured by the BET method and the particle density ($\rho$) [in the case of silica $\rho=2.2$].

The BET method is a method as described below.

First, 50 ml of silica sol (silica-based particle dispersion) to be subjected to measurement is adjusted with nitric acid to a pH of 3.5, and dried at 110° C. for 16 hours by addition of 40 ml of 1-propanol to obtain a sample. The sample is pulverized in a mortar and thereafter burned in a muffle furnace at 500° C. for 1 hour to obtain a measurement sample. Then, a known specific surface area meter (for example, type Multisorb 12 manufactured by Yuasa Ionics Co., Ltd.) is used to calculate the specific surface area from the amount of adsorbed nitrogen by a BET single point process according to the nitrogen adsorption method (BET method). In the specific surface area meter, a 0.5 g portion of the burned sample is placed in a measurement cell and subjected to degassing treatment at 300° C. for 20 minutes in a 30 vol % nitrogen/70 vol % helium gas mixture stream. Then, the sample is maintained at the liquid nitrogen temperature in the gas mixture stream to cause equilibrium adsorption of nitrogen onto the sample. Then, the temperature of the sample is gradually increased to room temperature while flowing the gas mixture, the amount of nitrogen detached during this process is detected, and the specific surface area (SA) of silica fine particles in the sample is calculated from a previously prepared calibration curve.

In cases where the silica-based particle group has a high specific surface area, sintering proceeds during burning according to the BET method, and the specific surface area (SA) is therefore determined by a titration method when the specific surface area (SA) is 100 $m^2/g$ or more.

The titration method is a method as described below.

First of all, a sample corresponding to 1.5 g of $SiO_2$ is collected in a beaker and placed in a thermostatic reactor (25° C.) and pure water is added to a liquid volume of 90 ml (the following operation is performed in the thermostatic reactor held at 25° C.). Next, a 0.1 mol/L aqueous hydrochloric acid solution is added to adjust the pH to 3.6. Further, 30 g of sodium chloride is added and the mixture is diluted with 150 ml of pure water and stirred for 10 minutes. Then, a pH electrode is set and a 0.1 mol/L sodium hydroxide solution is added dropwise with stirring to adjust the pH to 4.0. Further, the sample adjusted to the pH of 4.0 is titrated with the 0.1 mol/L sodium hydroxide solution, the titer and the pH value are recorded at 4 or more points in the pH range of 8.7 to 9.3, and a calibration curve is prepared by setting the titer of the 0.1 mol/L sodium hydroxide solution as X and the pH value at the time of titration as Y. The consumed amount V (ml) of the 0.1 mol/L sodium hydroxide solution required for 1.5 g of $SiO_2$ at a pH of 4.0 to 9.0 is determined from the expression $V=(A\times f\times 100\times 1.5)/(W\times C)$, and this is used to determine the specific surface area according to the expression $SA=29.0\ V-28$.

In the above expression, A means the titer (ml) of the 0.1 mol/L sodium hydroxide solution required for 1.5 g of $SiO_2$ at the pH of 4.0 to 9.0, f means the titer of the 0.1 mol/L sodium hydroxide solution, C means the $SiO_2$ concentration (%) in the sample, and W means the amount (g) of collected sample.

<Degree of Shape Irregularity>

The degree of shape irregularity is expressed by diving the above-mentioned weight-average particle size ($D_1$) by a projected area equivalent particle size ($D_3$). The projected area equivalent particle size ($D_3$) is measured and calculated by the method to be described below. First, surfaces of silica-based particles are taken at any points using a scanning electron microscope (SEM) at a magnification of 3,000× at 15 visual fields, one visual field having an area of $1.1\times10^{-3}$ $mm^2$. Then, as for all silica fine particles contained in each image taken at each visual field, the projected area of each particle is measured by the image analysis method using an image analysis system, the particle size of a circular particle (diameter of a circle) corresponding to each measured area is calculated, and the number average particle size (arithmetic mean diameter) is taken as the projected area equivalent particle size ($D_3$).

The silica-based particle group of the invention has a degree of shape irregularity D ($D=D_1/D_3$) ranging from 1.1 to 5.0, preferably 1.1 to 4.0, more preferably 1.1 to 3.0, and even more preferably 1.1 to 2.5. In other words, the silica-based particle group having a high degree of shape irregularity indicates that the particle group has a high average aspect ratio (average value of the ratio of the major axis length to the minor axis length of the minimum inscribed square). In cases where the average aspect ratio is high, particles mainly come into contact with a substrate at their major axis side during polishing to increase the area of contact with the substrate, leading to a higher polishing rate, which is preferable. However, in cases where the degree of shape irregularity exceeds 5.0, a further increase in the degree of shape irregularity does not contribute to improvement of the polishing rate and furthermore, scratches and waviness tend to occur easily. The degree of shape irregularity of less than 1.1 indicates that particles have a shape close to a spherical shape, and the polishing rate tends to be lowered in cases where polishing is performed using a silica-based particle dispersion containing the silica-based particle group having a degree of shape irregularity in the above range.

The aspect ratio means the ratio between the longer side length and the shorter side length (longer side length/shorter side length) in a rectangle (including a square) having the minimum area among the rectangles in which particles are inscribed. The average aspect ratio means a simple average value of the aspect ratios of particles of which the number is a certain number or more.

As long as the above-mentioned requirements [1], [2], and [3] are satisfied, the ratio of the irregularly shaped silica-based particles included in the silica-based particle dispersion containing the silica-based particle group including the irregularly shaped silica-based particles and the non-irregularly shaped silica-based particles according to the present invention is not particularly limited. However it is recommended that the ratio of the number of the irregularly shaped silica-based particles having an aspect ratio of 1.1 or more to the total number (the silica-based particle group) be preferably 50% or more and more preferably 55% or more.

The method of measuring the ratio of the number of the irregularly shaped silica-based particles having the aspect ratio of 1.1 or more will be described in Examples to be referred to later.

<Kurtosis>

The kurtosis of the silica-based particle group of the invention in the volume-based particle size distribution is preferably −20 to 20, more preferably −10 to 10, and most preferably −5 to 3. In cases where the silica-based particle group in which the kurtosis is in the above range is used as abrasive grains, a higher polishing rate can be obtained and a substrate having a smoother surface (smaller surface roughness (Ra), smaller waviness (Wa) of the substrate, and less scratching) can be obtained after polishing.

The kurtosis is only calculated from the particle size distribution irrespective of the shape and size of particles, and the case where the kurtosis is close to zero (normal distribution) indicates a particle size distribution close to a normal distribution. A particle size distribution having a larger kurtosis value than zero indicates that the peak center is sharp as compared with the normal distribution and the left and right tails of the distribution are wide (FIG. TA). A particle size distribution having a smaller kurtosis value than zero indicates that the peak is flat and the distribution has a shape in which the left and right tails are not wide (FIG. 1B).

According to the invention, the kurtosis of the silica-based particle group in the volume-based particle size distribution may have a negative value. Having a negative kurtosis indicates that the peak is flat, the amounts of the small particle component and the large particle component on the left and right of the distribution are small, respectively, and the distribution is a particle size distribution having a flat peak and a comparatively uniform particle size. In cases where the silica-based particle group in which the amounts of the small particle component and the large particle component are small is used as abrasive grains, the amount of residual abrasive grains is also small and the polishing rate is also high, and such cases are therefore preferable.

<Skewness>

The silica-based particle group of the invention preferably has a skewness in the volume-based particle size distribution of −20 to 20, more preferably −15 to 15, and most preferably −10 to 10. In cases where the silica-based particle group in which the skewness is in the above range is used as abrasive grains, a higher polishing rate can be obtained and a substrate having a smoother surface (smaller surface roughness (Ra), smaller waviness (Wa) of the substrate, and less scratching) can be obtained after polishing.

The skewness is only calculated from the particle size distribution irrespective of the shape and size of particles as in the kurtosis, and the case where the skewness is close to zero indicates a particle size distribution close to a normal distribution. A particle size distribution having a larger skewness value than zero indicates that the distribution has a peak on the left side of the distribution (side on which the particle size is small) and a long tail on the right side (FIG. 2A), whereas a particle size distribution having a smaller skewness value than zero indicates that the distribution has a peak on the right side of the distribution (side on which the particle size is large) and a long tail on the left side (FIG. 2B).

In general, the silica-based particle group obtained by the method which includes crushing and pulverization often has a positive skewness value in the volume-based particle size distribution, and particles obtained by the buildup method easily take a normal distribution and therefore often have a skewness value close to zero. The particle size distribution having a positive skewness is a distribution which has a peak at a position indicating a slightly small particle size and a wide tail on the large particle size side. When the silica-based particle group having the particle size distribution with the peak on the small particle size side as described above is used as abrasive grains, a smooth surface tends to be easily obtained after polishing because the component having a smaller particle size is used in a large amount. On the other hand, the silica-based particle group having a considerably large skewness provides a particle size distribution having a wide tail on the large particle size side, and when the silica-based particle group is used as abrasive grains, scratches tend to occur easily although the situation differs depending on the average particle size.

According to the invention, the skewness of the silica-based particle group in the volume-based particle size distribution may have a negative value. The silica-based particle group having a negative skewness value provides a particle size distribution which has a peak at a position indicating a larger particle size and a wide tail on the small particle side but scratches are less likely to occur even when the silica-based particle group is used as abrasive grains because the particle size distribution has a narrow tail on the large particle side (namely the amount of significantly large particles is small). However, the silica-based particle group having a skewness of less than −20 provides a particle size distribution in which the tail on the small particle side is too wide, and the amount of the small particle component is increased, so that residual abrasive grains are more likely to occur when the silica-based particle group is used as abrasive grains.

<Measurement of Volume-Based Particle Size Distribution and Method of Calculating Kurtosis and Skewness>

According to the invention, the volume-based particle size distribution of the silica-based particle group is measured by a centrifugal sedimentation technique. For instance, the volume-based particle size distribution can be measured using a known disc centrifuge particle size distribution meter (for example manufactured by CPS Instruments Inc.) after adjusting the solids concentration to 2 mass % through dilution of the silica-based particle dispersion with a 0.05 mass % aqueous sodium dodecyl sulfate solution.

The kurtosis and skewness are calculated by conventionally known expressions from the mean value and standard deviation of the volume-based particle size distribution obtained as described above. For instance, the kurtosis and skewness can be calculated using JMP Ver. 13.2 manufactured by SAS Institute Japan Ltd. In the volume-based particle size distribution, the frequency of a specified particle size may take in rare cases a negative value and in such cases the frequency is taken as zero for calculation.

<Multi-Peak Distribution>

After waveform separation according to the method to be described below, the volume-based particle size distribution of the silica-based particle group of the invention provides a multi-peak distribution in which three or more separation peaks are detected. In the case of a particle group having a single-peak distribution, a polishing rate and waviness according to the particle size occur. At a larger particle size, the polishing rate is high but the waviness is increased, and at a smaller particle size, the waviness is improved but the polishing rate is reduced. In contrast, in the case of a particle group having a multi-peak distribution, polishing proceeds as scratches due to polishing remain according to the particle sizes of the respective components, the total determines the waviness and the polishing rate. Therefore, the polishing rate can be compatible with the waviness in a distribution which shows sufficient polishing rates in both the large particle component and the small particle component (for example a trapezoidal distribution which contains large amounts of both small particles and large particles and which provides a multi-peak distribution after waveform separation).

Waveform separation is performed by analyzing the volume-based particle size distribution obtained by the above-mentioned disc centrifuge particle size distribution meter using a peak analyzer with graphing/data analysis software Origin (made by OriginLab Corporation). First, the baseline and the peak type are set to 0 and Gaussian, respectively. The local maximum point in the particle size distribution is selected as the peak position and peak fitting is performed without weighting. The calculated peaks are checked to see if the conditions 1 and 2 described below are satisfied. When the conditions are not satisfied, peak fitting is repeated while shifting the peak position to arbitrary positions within the distribution range until the conditions 1 and 2 are satisfied. Then, when the corrected R squared value is 0.99 or less, a peak is added at an arbitrary position in the distribution range and peak fitting is repeated until the corrected R squared value is increased to 0.99 or more. The number of the separation peaks is taken as the number of peaks.

Condition 1: Each calculated peak does not have a larger value than in the original distribution.

Condition 2: Each calculated peak does not have a negative value.

Such a silica-based particle group in which the volume-based particle size distribution is a multi-peak distribution has a wide distribution (broad distribution) covering large particles and small particles, and has more advantageous polishing performance.

Specifically, the ratio of the volume at the maximum peak after waveform separation to the total volume is desirably 75% or less. This is because when the ratio of the maximum peak volume is 75% or less, a broad distribution is obtained, and a multi-peak distribution having three or more separation peaks is more likely to be formed after waveform separation.

When the ratio of the maximum peak volume exceeds 75%, the distribution is substantially close to a single-peak distribution and the number of separation peaks is more likely to be less than 3 even if the volume-based particle size distribution as described above is subjected to waveform separation.

Further, in the silica-based particle group of the invention, the ratio of the volume of the maximum particle component in the separation peaks detected during waveform separation of the volume-based particle size distribution is preferably 75% or less and more preferably 73% or less. When such a silica-based particle group is used as abrasive grains, the amount of the large particle component is small and surface roughness and waviness of a substrate are more improved during polishing. The "maximum particle component" as used in the invention refers to a particle component contained at the separation peak located on the side of particles having the largest particle size during waveform separation of the volume-based particle size distribution of the silica-based particle group.

<Aspect Ratio>

In the silica-based particle group of the invention, the aspect ratio of the small particle side component in the number-based particle size distribution obtained as a result of SEM image analysis is preferably in the range of 1.05 to 5.0, more preferably 1.05 to 3.0, even more preferably 1.05 to 2.0, and still more preferably 1.05 to 1.5. The aspect ratio of the small particle side component in the number-based particle size distribution obtained by SEM image analysis is measured and calculated by the method to be described below. First, a known scanning electron microscope (SEM) and a known image analysis system are used to count the total number of particles in the silica-based particle group. The area of each particle is calculated, and the diameter of a circle having an area equal to the above area is determined and taken as the particle size. Then, the particles are arranged in order of increasing particle size obtained. Counting is performed from the smaller side and particles covering one-third of the number of particles are deemed to be included in the small particle side component. The aspect ratio (ratio of the major axis length to the minor axis length of the minimum inscribed square) of each particle in the small particle side component is determined. A simple average value of the aspect ratios is taken as the "aspect ratio of the small particle side component."

The aspect ratio of the small particle side component in the silica-based particle group of the invention is usually smaller than the average aspect ratio of the silica-based particle group. When the aspect ratio of the small particle side component is less than 1.05, such particles are substantially equivalent to spherical particles and the polishing rate is therefore low and the polishing rate of the silica-based particle group is also more likely to be reduced. However, when the silica-based particle group having an aspect ratio of the small particle side component in the range of 1.05 or more is used as abrasive grains, the small particle side component also exhibits a high polishing rate and the polishing rate of the silica-based particle group can be therefore further increased, and defects and the like are less likely to occur, thus obtaining a high surface accuracy. When the aspect ratio of the small particle side component is larger than 5.0, the average aspect ratio of the whole of the silica-based particle group is also increased more. Accordingly, although the polishing rate is increased, the substrate is more likely to have defects, and further the roughness of the substrate surface and waviness of the substrate surface are more likely to be deteriorated.

Exemplary methods of forming particles containing bound single particles and having a high aspect ratio include a method which involves associating particles having a size of several tens of nanometers through ionic strength adjustment or by the use of polymers thereby increasing the aspect ratio, and a method which involves adjusting the ionic strength or the like simultaneously with nucleation during blending of particles to associate the particles, and causing generated irregularly shaped seed particles to further grow to obtain particles having a high aspect ratio. In the case of these methods, however, particles having a high aspect ratio are formed and at the same time non-associated particles are also more likely to remain, so that particles having a small particle size are more likely to be particles having a shape close to a spherical shape and a low aspect ratio. Spherical particles are more likely to have a low polishing rate as a whole of the particle group because of their low polishing rate. In contrast, the silica-based particle group including the irregularly shaped silica-based particles according to the invention also contains irregularly shaped particles in the small particle side component owing to the compacting action in the crushing step and a high polishing rate can be therefore obtained.

<Coefficient of Variation (CV Value)>

The coefficient of variation of the particle size of the volume-based particle size distribution in the silica-based particle group according to the invention is preferably 30% or more and more preferably 50% or more. A broad volume-based particle size distribution is obtained by adjusting the coefficient of variation in the predetermined range. In other words, the silica-based particle group has a broad particle size distribution and exhibits more advantageous polishing performance. The "coefficient of variation (CV value)" as used in the invention refers to a value obtained by diving the standard deviation by the mean value, is expressed by percentage and shows relative dispersion.

The CV value of the invention is determined from the volume-based particle size distribution using a disc centrifuge particle size distribution meter (manufactured by CPS Instruments Inc.).

<Smoothness S>

The smoothness S ($S=S_2/S_1$) in the silica-based particle group according to the invention as expressed by the ratio of the area ($S_2$) of a circle equivalent to the average peripheral length according to the image analysis method to the average area ($S_1$) according to the image analysis method is preferably in the range of 1.1 to 5.0, and more preferably 1.3 to 4.0. An S value of higher than 1.0 indicates that the irregularly shaped silica-based particles contained in the silica-based particle group do not have a smooth surface but their surfaces have a shape of fine recesses and protrusions. This is because the irregularly shaped seed particles are aggregated primary particles and porous, so that surfaces of the seed particles also have fine protrusions, and irregularly shaped silica-based particles obtained by particle growth of the seed particles have a shape in which the fine protrusions are kept. Further, in cases where the silica-based particle group including the irregularly shaped silica-based particles which have suitable fine protrusions at their surfaces is used as polishing abrasive grains, the polishing pressure is concentrated on the protrusions and a high polishing rate is therefore obtained. When the protrusions at the particle surfaces are considerable, surface roughness and waviness of the substrate surface are not deteriorated after polishing but abrasive grains are more likely to be worn out while reducing the polishing rate.

Measurement and calculation of the average area ($S_1$) according to the image analysis method and the area ($S_2$) of the circle equivalent to the average peripheral length according to the image analysis method in the silica-based particle group are now described.

These are measured and calculated by the methods to be described below. First, surfaces of particles are taken at any points using a known scanning electron microscope (SEM) at a magnification of 3,000× at 15 visual fields, one visual field having an area of $1.1\times10^3$ $mm^2$. All silica fine particles contained in each image taken at each visual field are subjected to measurement of the area and the peripheral length of each particle using a known image analysis system; the average area ($S_1$) (simple average value) and the average peripheral length (simple average value) are calculated from each data of the area and the peripheral length obtained by the measurement, and the area ($S_2$) of a circle equivalent to the average peripheral length (circle having a circumference equal to the average peripheral length) is further calculated from the average peripheral length.

<$Q_2/Q_1$>

The silica-based particle group of the invention has, in its volume-based particle size distribution, a ratio Q of the volume ($Q_2$) of particles having a size or 0.7 μm or more to the total volume ($Q_1$) ($Q=Q_2/Q_1$, expressed by percentage) of preferably 1.2% or less, and more preferably 1.0% or less. The ratio of coarse large particles is low in such a silica-based particle group and defects such as scratches are therefore less likely to occur during polishing and the surface roughness of the polished substrate can be further reduced.

The total volume ($Q_1$) of the silica-based particle group of the invention in the volume-based particle size distribution, the volume ratios of respective components at separation peaks obtained as a result of waveform separation thereof, the ratio of the volume of the maximum particle component, and the volume ($Q_2$) of particles having a size of 0.7 μm or more can also be measured by the above-mentioned method using the disc centrifuge particle size distribution meter.

<Internal Pores and Coating Silica Layer>

Irregularly shaped porous silica-based gel-including particles are used as seed particles and the seed particles are grown with the use of a silicic acid solution to obtain the irregularly shaped silica-based particles contained in the silica-based particle group according to the invention. During particle growth, neck portions between primary particles in the seed particles are preferentially filled with silicic acid but some pores remain. Therefore, the irregularly shaped silica-based particles of the invention have a plurality of fine internal pores in the interiors (cores) of the particles. The density of the particles is lower than the silica-based particles having a compact interior but the strength is high. The internal pores preferably have an average pore size of 20 nm or less. This is because when the internal pore size is too large, the strength of the particles is more likely to be lowered.

The particle surface is provided with a coating silica layer for coating the core having the above-mentioned plurality of fine internal pores. Preferably, the coating silica layer contains a small number of internal pores, has an average thickness in the range of 1 to 50 nm, and is primarily composed of silica. When the average thickness is less than 1 nm, the strength of the particles is less likely to be improved. When the average thickness exceeds 50 nm, the number of internal pores in the particles is reduced, the degree of shape irregularity is also further reduced to lower the polishing rate.

Furthermore, when there is no coating silica layer or the layer thickness is less than 1 nm, the strength is low and particles are broken during polishing and the polishing rate is therefore less likely to be improved. Further, the dispersion of the polishing rate is more likely to be increased when polishing is repeatedly performed.

The particles having the internal pores desirably have a pore volume of 0.01 to 1.00 ml/g. When the pore volume is less than 0.01 ml/g, the particles substantially have no pores inside, and the effect of improving the polishing rate depending on increases in the number of particles in the particle group is less likely to be obtained. When the pore volume exceeds 1.00 ml/g, the particles lack in strength and are broken during polishing and the polishing rate is therefore more likely to be lowered.

The expression "primarily composed of" in the invention means that the content is 90 mass % or more. In other words, the silica content in the coating silica layer is preferably 90 mass % or more. The content is more preferably 95 mass % or more, even more preferably 98 mass % or more, and most preferably 99.5 mass % or more.

Methods for measuring the average pore size of the core internal pores and the average thickness of the coating silica layer in the irregularly shaped silica-based particles contained in the silica-based particle group according to the invention are as follows:

First, the irregularly shaped silica-based particles of the invention are observed by a transmission electron microscope (TEM) at a magnification of 200,000×; the maximum diameter of one particle is deemed as a major axis length and a point dividing the major axis length on the major axis into two halves is determined; two points of intersection of a line orthogonal to the major axis at the point with the periphery of the particle are determined; and the distance between the two points is taken as a minor axis length. Thicknesses of the coating silica layer on both sides of the major axis and the minor axis are determined and their simple average value is taken as the average thickness of the coating silica layer of one particle. The thickness of the coating silica layer of each of arbitrary 20 particles is determined in the same manner and the simple average value is taken as the average thickness of the coating silica layer of the irregularly shaped silica-based particles.

Further, the sizes of the pores present on the major axis and the minor axis are determined and their average is taken as the average pore size of one particle. The pore size is determined in the same manner in arbitrary 20 particles and the simple average value is taken as the average pore size of the irregularly shaped silica-based particles.

Each of the irregularly shaped silica-based particles of the invention has the core including the plurality of fine pores in its interior and the coating silica layer covering the core, whereby the number of pores to be substituted with water is reduced to lower the particle density. When the particle density is reduced, the number of particles per mass is increased and the area of contact with the substrate is therefore increased to have a higher polishing rate. When the number of particles is increased, a load applied to one particle is reduced. Therefore, the substrate is moderately ground with the particles and the surface roughness and waviness of the substrate are therefore more likely to be improved. Further, particles have pores inside but have a compact coating silica layer as the outer layer. Accordingly, the particles have a higher strength and breakage of the particles can be prevented from occurring due to polishing pressure. Therefore, the polishing rate is increased. On the other hand, the polishing rate is considerably reduced in the porous silica-based particles which are not provided with the coating silica layer as described above because breakage of the particles occur due to polishing pressure.

<Polishing Abrasive Grain Dispersion>

The silica-based particle dispersion containing the silica-based particle group of the invention dispersed in a dispersion solvent (silica-based particle dispersion containing the silica-based particle group according to the invention) can be preferably used as the polishing abrasive grain dispersion (hereinafter referred to also as "polishing abrasive grain dispersion of the invention"). In particular, the silica-based particle dispersion can be preferably used to polish magnetic disks. Further, the silica-based particle dispersion can be advantageously used as the polishing abrasive grain dispersion for flattening a semiconductor substrate having an $SiO_2$ insulating film formed thereon. The silica-based particle dispersion can be also advantageously used as a polishing slurry by adding a chemical component for controlling the polishing performance.

The polishing abrasive grain dispersion of the invention has excellent effects including a high polishing rate in polishing a magnetic disk, a semiconductor substrate or the like, a small number of scratches at a polished surface during polishing, and a small amount of residual abrasive grains on a substrate, and the polishing operation efficiency can be significantly improved.

The polishing abrasive grain dispersion of the invention contains water and/or an organic solvent as a dispersion solvent. Water such as pure water, ultrapure water, or ion-exchanged water is preferably used as the dispersion solvent. Further, the polishing abrasive grain dispersion of the invention is more advantageously used as a polishing slurry by adding to the polishing abrasive grain dispersion of the invention one or more additives for controlling the polishing performance, which are selected from the group consisting of a polishing accelerator, a surfactant, a heterocyclic compound, a pH adjuster, a pH buffer, and a sedimentation inhibitor.

<Polishing Accelerator>

Although the polishing accelerator to be used differs depending on the type of a member to be polished, a conventionally known polishing accelerator can be added to the polishing abrasive grain dispersion of the invention when necessary and used as a polishing slurry. Examples of the polishing accelerator as described above include hydrogen peroxide, peracetic acid, urea peroxide, and a mixture thereof. When an abrasive composition containing the polishing accelerator such as hydrogen peroxide is used, the polishing rate can be effectively improved when a member to be polished is made of metal.

Other examples of the polishing accelerator include inorganic acids such as sulfuric acid, nitric acid, phosphoric acid, oxalic acid, and hydrofluoric acid; an organic acid such as acetic acid; a sodium salt, a potassium salt, an ammonium salt, and an amine salt of these acids; and a mixture thereof. When polishing a member composed of composite components using the polishing composition containing any of the polishing accelerators described above, the polishing rate can be accelerated for specific components of the member to be polished to thereby finally obtain a polished flat surface.

When the polishing abrasive grain dispersion of the invention contains the polishing accelerator, the polishing accelerator content is preferably 0.1 to 10 mass %, and more preferably 0.5 to 5 mass %.

<Surfactant and/or Hydrophilic Compound>

A cationic, anionic, nonionic or amphoteric surfactant or a hydrophilic compound can be added to improve the dispersibility and stability of the polishing abrasive grain dispersion of the invention. Both the surfactant and the hydrophilic compound have the effects of reducing the angle of contact with the surface to be polished and accelerating uniform polishing. The surfactant and/or the hydrophilic compound can be, for instance, selected for use from the group shown below:

Examples of the anionic surfactant include carboxylate salts, sulfonate salts, sulfate ester salts, and phosphate ester salts. Exemplary carboxylate salts include soap, N-acylamino acid salts, polyoxyethylene or polyoxypropylene alkyl ether carboxylate salts, and acylated peptides. Exemplary sulfonate salts include alkyl sulfonate salts, alkylbenzene and alkyl naphthalene sulfonate salts, naphthalene sulfonate salts, sulfosuccinate salts, $\alpha$-olefin sulfonate salts, and N-acyl sulfonate salts. Exemplary sulfate ester salts include sulfated oils, alkyl sulfate salts, alkyl ether sulfate salts, polyoxyethylene or polyoxypropylene alkyl allyl ether sulfate salts, and alkyl amido sulfate salts. Exemplary phosphate ester salts include alkyl phosphate salts and polyoxyethylene or polyoxypropylene alkyl allyl ether phosphate salts.

Examples of the cationic surfactant include aliphatic amine salts, aliphatic quaternary ammonium salts, benzalkonium chloride salts, benzethonium chloride, pyridinium salts, and imidazolinium salts. Examples of the amphoteric surfactant include carboxybetaine surfactants, sulfobetaine surfactants, aminocarboxylate salts, imidazolinium betaines, lecithins, and alkylamine oxides.

Examples of the nonionic surfactant include ether surfactants, ether ester surfactants, ester surfactants, and nitrogen-containing surfactants. Exemplary ether surfactants include polyoxyethylene alkyl and alkylphenyl ethers, alkyl allyl formaldehyde-condensed polyoxyethylene ethers, polyoxyethylene polyoxypropylene block polymers, and polyoxyethylene polyoxypropylene alkyl ethers. Exemplary ether ester surfactants include polyoxyethylene ethers of glycerin esters, polyoxyethylene ethers of sorbitan esters, and polyoxyethylene ethers of sorbitol esters. Exemplary ester surfactants include polyethylene glycol fatty acid esters, glycerin esters, polyglycerin esters, sorbitan esters, propylene glycol esters, and sucrose esters. Exemplary nitrogen-containing surfactants include fatty acid alkanolamides, polyoxyethylene fatty acid amides, and polyoxyethylene alkylamides. Other exemplary surfactants include fluorosurfactants.

Anionic surfactants or nonionic surfactants are preferred surfactants. Exemplary salts include ammonium salts, potassium salts and sodium salts, and ammonium salts and potassium salts are particularly preferred.

Furthermore, other exemplary surfactants and hydrophilic compounds include esters such as glycerin ester, sorbitan ester, and alanin ethyl ester; ethers such as polyethylene glycol, polypropylene glycol, polytetramethylene glycol, polyethylene glycol alkyl ether, polyethylene glycol alkenyl ether, alkyl polyethylene glycol, alkyl polyethylene glycol alkyl ether, alkyl polyethylene glycol alkenyl ether, alkenyl polyethylene glycol, alkenyl polyethylene glycol alkyl ether, alkenyl polyethylene glycol alkenyl ether, polypropylene glycol alkyl ether, polypropylene glycol alkenyl ether, alkyl polypropylene glycol, alkyl polypropylene glycol alkyl ether, alkyl polypropylene glycol alkenyl ether, and alkenyl polypropylene glycol; polysaccharides such as alginic acid, pectic acid, carboxymethyl cellulose, curdlan, and pullulan; amino acid salts such as glycine ammonium salt and glycine sodium salt; polycarboxylic acids and their salts such as polyaspartic acid, polyglutamic acid, polylysine, polymalic acid, polymethacrylic acid, poly(ammonium methacrylate), poly(sodium methacrylate), polyamide acid, polymaleic acid, polyitaconic acid, polyfumaric acid, poly(p-styrene carboxylic acid), polyacrylic acid, polyacrylamide, aminopolyacrylamide, poly(ammonium acrylate), poly(sodium acrylate), polyamide acid, ammonium salt of polyamide acid, sodium salt of polyamide acid, and polyglyoxylic acid; vinyl polymers such as polyvinyl alcohol, polyvinylpyrrolidone, and polyacrolein; sulfonic acid and its salts such as ammonium methyl taurate, sodium methyl taurate, sodium methyl sulfate, ammonium ethyl sulfate, ammonium butyl sulfate, sodium vinyl sulfonate, sodium 1-allyl sulfonate, sodium 2-allyl sulfonate, sodium methoxymethyl sulfonate, ammonium ethoxymethyl sulfonate, and sodium 3-ethoxypropyl sulfonate; and amides such as propionamide, acrylamide, methylurea, nicotinamide, succinic amide, and sulfanilamide.

When a substrate to be applied for polishing is a glass substrate or the like, any surfactant may be advantageously used. However, when an effect of contamination with an alkali metal, an alkaline-earth metal or a halide is to be avoided in a silicon substrate for a semiconductor integrated circuit or the like, a surfactant of an acid or its ammonium salt is desirably used.

When the polishing abrasive grain dispersion of the invention contains a surfactant and/or a hydrophilic compound, the surfactant and the hydrophilic compound are preferably contained in a total amount of 0.001 to 10 g, more preferably 0.01 to 5 g, and particularly preferably 0.1 to 3 g per L of the polishing abrasive grain dispersion.

The surfactant and/or the hydrophilic compound is contained in an amount of preferably 0.001 g or more per L of the polishing abrasive grain dispersion in order to obtain advantageous effects, and in an amount of preferably 10 g or less per L of the polishing abrasive grain dispersion in order to prevent reduction of the polishing rate.

The surfactants or the hydrophilic compounds may be used alone or in combination of two or more, and different types of surfactants or hydrophilic compounds may also be used in combination.

<Heterocyclic Compound>

When metal is included in the substrate to be polished, a heterocyclic compound may be contained in the polishing abrasive grain dispersion of the invention for the purpose of suppressing erosion of the substrate to be polished through formation of a passive layer or a dissolution inhibiting layer on the metal. The heterocyclic compound is a compound having a heterocycle containing at least one heteroatom. The heteroatom refers to an atom other than carbon atom and hydrogen atom. The heterocycle refers to a cyclic compound having at least one heteroatom. The heteroatom only refers to an atom that forms a constituent portion of a ring system of a heterocycle, and does not refer to an atom that is positioned outside the ring system, or is separated from the ring system by at least one non-conjugated single bond, or forms a part of a further substituent of the ring system. Preferred examples of the heteroatom include, but are not limited to, nitrogen atom, sulfur atom, oxygen atom, selenium atom, tellurium atom, phosphorus atom, silicon atom, and boron atom. Examples of the heterocyclic compound that may be used include imidazole, benzotriazole, benzothiazole, and tetrazole. More specific examples of the heterocyclic compound include, but are not limited to, 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, and 3,5-diamino-1,2,4-triazole.

When the polishing abrasive grain dispersion of the invention contains the heterocyclic compound, the heterocyclic compound content is preferably 0.001 to 1.0 mass %, more preferably 0.001 to 0.7 mass %, and even more preferably 0.002 to 0.4 mass %.

<pH Adjuster>

An acid or a base, or a salt compound thereof can be optionally added to enhance the effects of the above-mentioned additives, thereby adjusting the pH of the polishing composition.

When the polishing abrasive grain dispersion of the invention is adjusted to a pH of 7 or more, an alkaline pH adjuster is used. Sodium hydroxide, ammonia water, ammonium carbonate, and amines such as ethylamine, methylamine, triethylamine, and tetramethylamine are desirably used.

When the polishing abrasive grain dispersion of the invention is adjusted to a pH of less than 7, an acidic pH adjuster is used. For example, hydroxy acids such as acetic acid, lactic acid, citric acid, malic acid, tartaric acid, and glyceric acid, and mineral acids such as hydrochloric acid and nitric acid are used.

<pH Buffer>

The pH buffer may be used to keep the pH of the polishing abrasive grain dispersion of the invention at a constant value. Examples of the pH buffer that may be used include phosphates and borates such as ammonium dihydrogen phosphate, diammonium hydrogen phosphate, and ammonium tetraborate tetrahydrate, and organic acid salts.

<Sedimentation Inhibitor>

The sedimentation inhibitor may be added to the polishing abrasive grain dispersion of the invention for the purpose of inhibiting sedimentation and easily dispersing even when sedimentation occurs. The sedimentation inhibitor is not particularly limited, and examples thereof include polycarboxylic acid surfactant, anionic polymeric surfactant, cationic surfactant, sodium polyacrylate, carboxylic acid copolymer sodium salt, carboxylic acid copolymer ammonium salt, ammonium polyacrylate, polyacrylic acid, sulfonic acid copolymer sodium salt, fatty acid salt, α-sulfo fatty acid ester salt, alkylbenzene sulfonate salt, alkyl sulfate salt, alkyl ether sulfate ester, alkyl sulfate triethanolamine, fatty acid diethanolamide, polyoxyethylene alkyl ether, polyoxyethylene alkyl phenyl ether, alkyl trimethyl ammonium salt, dialkyl dimethyl ammonium chloride, alkylpyridium chloride, alkylcarboxybetaine, styrene-maleic anhydride copolymer, formalin bound naphthalene sulfonate, carboxymethylcellulose, olefin-maleic anhydride copolymer, sodium alginate, polyvinyl alcohol, polyalkylene polyamine, polyacrylamide, polyoxypropylene-polyoxyethylene block, polymer starch, polyethylenimine, aminoalkyl acrylate copolymer, polyvinylimidazoline, and satokinsan.

When the sedimentation inhibitor is added to the polishing abrasive grain dispersion of the invention, the sedimentation inhibitor is preferably contained in a total amount of 0.001 to 10 g, more preferably 0.01 to 5 g, and particularly preferably 0.1 to 3 g per L of the polishing abrasive grain dispersion. The sedimentation inhibitor is contained in an amount of preferably 0.001 g or more per L of the polishing abrasive grain dispersion in order to obtain advantageous effects, and in an amount of preferably 10 g or less per L of the polishing abrasive grain dispersion in order to prevent reduction of the polishing rate.

An organic solvent can be used as the dispersion solvent in the polishing abrasive grain dispersion of the invention. Examples of the organic solvent include alcohols such as methanol, ethanol, isopropanol, n-butanol, and methyl isobutyl carbinol; ketones such as acetone, 2-butanone, ethyl amyl ketone, diacetone alcohol, isophorone, and cyclohexanone; amides such as N, N-dimethylformamide, and N,N-dimethylacetamide; ethers such as diethyl ether, isopropyl ether, tetrahydrofuran, 1,4-dioxane, and 3,4-dihydro-2H-pyran; glycol ethers such as 2-methoxyethanol, 2-ethoxyethanol, 2-butoxyethanol, and ethylene glycol dimethyl ether; glycol ether acetates such as 2-methoxyethyl acetate, 2-ethoxyethyl acetate, and 2-butoxyethyl acetate; esters such as methyl acetate, ethyl acetate, isobutyl acetate, amyl acetate, ethyl lactate, and ethylene carbonate; aromatic hydrocarbons such as benzene, toluene and xylene; aliphatic hydrocarbons such as hexane, heptane, isooctane, and cyclohexane; halogenated hydrocarbons such as methylene chloride, 1,2-dichloroethane, dichloropropane, and chlorobenzene; sulfoxides such as dimethyl sulfoxide; and pyrrolidones such as N-methyl-2-pyrrolidone, and N-octyl-2-pyrrolidone. These may be mixed with water for use.

The solids concentration in the polishing abrasive grain dispersion of the invention is preferably in the range of 0.3 to 50 mass %. When the solids concentration is too low, the polishing rate may be reduced. Even when the solids concentration is too high to the contrary, the polishing rate is hardly further increased, which may be uneconomical.

<Method of Producing Silica-Based Particle Group Including Irregularly Shaped Silica-Based Particles and Non-Irregularly Shaped Silica-Based Particles>

Next, a method of producing a silica-based particle group including irregularly shaped silica-based particles and non-irregularly shaped silica-based particles according to the invention is specifically described.

This is a method including a step a which involves subjecting a porous silica-based gel to wet crushing in an alkaline state to obtain a solution containing irregularly shaped porous silica-based gel-including particles; a step b which involves adding a silicic acid solution to the solution containing the irregularly shaped porous silica-based gel-including particles in the alkaline state and heating the solution to cause the particles to grow with their shape remaining irregular while filling pores between primary particles in the irregularly shaped porous silica-based gel-including particles by a reaction with silicic acid contained in the silicic acid solution, thereby obtaining irregularly shaped silica-based particles; and a step c which involves concentrating a silica-based particle group including the irregularly shaped silica-based particles having grown and collecting the concentrated silica-based particle group.

[Step a]

This step uses a porous silica-based gel as a starting material. As long as a porous silica-based gel is used, the porous silica-based gel may be not only silica gel but also a composite gel such as silica-alumina gel, silica-titania gel, or silica-zirconia gel. The gel may be in the state of hydrogel, xerogel, or organogel. This is the step in which the porous silica-based gel as described above is subjected to wet crushing in an alkaline state to obtain a solution containing irregularly shaped porous silica-based gel-including particles. The porous silica-based gel is pulverized and used as seed particles, whereby the seed particles also have a porous nature. Further, the obtained seed particles hardly have a spherical shape and are irregularly shaped particles. This tendency is noticeable in cases where seed particles having a large particle size are prepared by pulverization, and the degree of shape irregularity is more likely to be lowered when the gel is pulverized to a smaller seed size. Then, in the subsequent step b, the added silicic acid solution is deposited while intruding on the silica surfaces of the irregularly shaped porous silica-based gel-including particles (seed particles) and their interiors up to about several tens of nanometers. Differences in solubility cause silicic acid to be preferentially reacted at pores having no relation to the particle size to fill the pores, and silica is deposited on the outer surfaces of particles to promote growth of the particles (this will be referred to as buildup in the following description). Through the buildup, protrusions at the particle outer surfaces further contribute to increasing the outer diameter and recesses contribute less to the outer shape, and therefore the strength of the particles having grown is increased and the particles are controlled to keep their irregular shape, whereby irregularly shaped silica-based particles having a large particle size can be produced. When seed particles having a large particle size (for example, seed particles having a particle size of 100 nm or more) are built up, the silicic acid solution cannot be intruded into the pores over the depth of about several tens of nanometers, and therefore after the surface portion of the several tens of nanometers is filled, silica is only deposited on the particle outer surfaces and pores remain inside. Then, the seed particles having a large particle size have a high degree of shape irregularity and irregularly shaped silica-based particles each having a structure which includes a core having a plurality of pores in its interior and a coating silica layer covering the core are formed by the buildup. On the other hand, in cases where seed particles having a small particle size are built up, almost all of pores between primary particles are more likely to be filled with silica to a state close to compact silica-based particles.

According to the invention, the porous silica-based gel is used as the production material. The silica-based gel is porous and has therefore a low strength. Then, even if the porous silica-based gel is pulverized to a weight-average particle size of several hundred nanometers, fine particles having a size of about several tens of nanometers are also simultaneously generated during pulverization. Therefore, in cases where the porous silica-based gel is used as the production material, a wide variety of particles including small particles and large particles are obtained by pulverization. As described above, buildup of seed particles having a large particle size leads to a structure having pores inside, while buildup of seed particles having a small particle size is more likely to cause filling of internal pores. Then, the silica-based particle group of the invention has a large weight-average particle size and also includes fine particles at the same time and the skewness and the kurtosis are therefore increased.

The porous silica-based gel for use as the production material is preferably easily crushed gel. For example, wet hydrogel obtained by cleaning gel according to the water glass method, xerogel, white carbon, and gel using the alkoxide method are preferable. In the gel using the alkoxide method, the number of hydroxyl groups to be subjected to dehydration condensation is small and the dry powder is therefore soft, and the gel can be used as dry powder with good productivity. The particle size distribution of the irregularly shaped porous silica-based gel-including particles which are obtained by crushing the porous silica-based gel is preferably controlled to fall within a certain range. When having large gel aggregates which are not easily crushed, the porous silica-based gel requires time for crushing and is more likely to have a wide particle size distribution, and is therefore not preferable.

The pore volume and the specific surface area can be used as parameters indicating the porosity of the porous silica-based gel. In the case of open pores, there is an approximately proportional relationship between the specific surface area and the pore volume as long as the pore size is the same. In the present invention, the specific surface area (SA) was used as the parameter indicating the porosity of the porous silica-based gel.

The porous silica-based gel for use in the invention preferably has a specific surface area of 300 to 800 $m^2/g$. In a specific surface area of less than 300 $m^2/g$, the number of pores between the primary particles in the porous silica-based gel is small and therefore when the silicic acid solution is added to the solution containing the irregularly shaped porous silica-based gel-including particles obtained by crushing, the amount of silicic acid that may intrude into the pores between the primary particles in the irregularly shaped porous silica-based gel-including particles is small, and the pores are not easily filled by the reaction with the silicic acid. The silicic acid solution having been added is consumed to grow the particles to have a round shape and the particles are less likely to keep the irregular shape. When the specific surface area is more than 800 $m^2/g$, the particle strength is too low and irregularly shaped silica-based particles having a sufficient strength are less likely to be obtained even if the interiors of the irregularly shaped porous silica-based gel-including particles which were obtained by crushing are partially filled by buildup under the reaction with the silicic acid.

The porous silica-based gel desirably has a size (particle size) of 1 μm to 10 mm.

The porous silica-based gel is subjected to wet crushing in an alkaline state to obtain the irregularly shaped porous silica-based gel-including particles. The irregularly shaped porous silica-based gel-including particles can be advantageously prepared particularly by simultaneously subjecting comparatively soft silica-based gel having a specific surface area of about 300 to 800 $m^2/g$ to deformation and crushing under a high shear force using a bead mill or the like. For example, a glass medium-containing sand mill or bead mill is used for crushing. Crushing is preferably performed a plurality of times.

In general, in cases where powder is pulverized in a bead mill or the like, the particle size of the powder is reduced in proportion to the time of pulverization. However, soft powder having a high surface area such as silica-based gel has moderate changes of the particle size with respect to the time of pulverization, and is crushed to particles having a weight-average particle size of about 80 to 550 nm. The irregularly shaped porous silica-based gel-including particles have a coarse structure containing a significantly large number of necks or pores between the primary particles while keeping the specific surface area before crushing. Therefore, even if the particles are directly used as an abrasive, the particles are more likely to be broken for lack of strength and the obtained polishing rate is very low. Then, according to the invention, the strength of the particles is enhanced in the subsequent step b by adding the silicic acid solution to the solution containing the irregularly shaped porous silica-based gel-including particles and filling the pores between the primary particles inside the irregularly shaped porous silica-based gel-including particles with the silicic acid solution through buildup. The silicic acid solution for use in buildup may be derived from an alkoxide or sodium silicate, or amine silicate. As long as the pores between the primary particles can be filled, the material is not limited to silicic acid but may be selected from silicate salts such as alkali salts and alkaline-earth salts of silicic acid.

In the step a, the porous silica-based gel is subjected to wet crushing in the alkaline state, namely under the alkaline condition, and the alkaline pH is preferably in the range of 8.0 to 11.5. As the pH is reduced below the alkaline area, the negative potential is gradually reduced and the potential is unstable in the neutral area and acidic area and therefore particles formed by crushing cannot be present stably but tend to be aggregated immediately. At a pH exceeding 11.5, dissolution of silica is promoted and the particles therefore tend to be aggregated. It is recommended that the pH during the wet crushing be advantageously in the range of 8.5 to 11.0.

The method for pH adjustment is not particularly limited. For instance, the pH can be adjusted by adding sodium hydroxide or the like.

The irregularly shaped porous silica-based gel-including particles which were obtained by the wet crushing preferably have a weight-average particle size of 80 to 550 nm. When the weight-average particle size of the irregularly shaped porous silica-based gel-including particles is less than 80 nm, it may be difficult to have a particle size suitable as an abrasive even if the particles are thereafter grown by adding the silicic acid solution. When the weight-average particle size of the irregularly shaped porous silica-based gel-including particles is more than 550 nm, the particle size suitable as an abrasive may be exceeded and such weight-average particle size is therefore not preferred so much. Coarse particles in which the particle size suitable as an abrasive is exceeded may cause scratches. Coarse large particles and large particles tend to be preferentially crushed by crushing but centrifugation may be performed for the purpose of removing coarse large particles remaining in the irregularly shaped porous silica-based gel. It is recommended that the irregularly shaped porous silica-based gel-including particles preferably have a weight-average particle size of 120 to 400 nm.

The weight-average particle size of the irregularly shaped porous silica-based gel-including particles means a value obtained by the measurement using the same method as the above-mentioned method for the weight-average particle size ($D_1$) of the silica-based particle group.

This crushing can be performed at multiple stages using media of which the material and the size are different. For instance, when the porous silica-based gel is crushed using a large-sized zirconia medium, first-stage crushing can be performed at a high rate in a short time under a high shear force. When second-stage crushing is subsequently performed using a glass medium having a smaller size than in the first stage, crushing proceeds under a moderate shear force and the particle size can be adjusted to a desired value. In this process, breakage starts from portions having a low strength between the primary particles, so that shape irregularity is more likely to occur simultaneously with refinement. Because of the wet crushing under the alkaline condition, some of the irregularly shaped porous silica-based gel-including particles are dissolved and neck portions between the primary particles can be preferentially filled, so that excessive refinement does not proceed during the crushing.

[Step b]

This step is a buildup step which involves adding the silicic acid solution to the solution containing the irregularly shaped porous silica-based gel-including particles in the alkaline state and heating the solution to cause the particles to grow with their shape remaining irregular while filling the pores between the primary particles in the irregularly shaped porous silica-based gel-including particles by a reaction with silicic acid. The solution containing the irregularly shaped porous silica-based gel-including particles preferably has an $SiO_2$ concentration of 1 to 10 mass %. When the $SiO_2$ concentration of the solution containing the irregularly shaped porous silica-based gel-including particles is less than 1 mass %, the efficiency in the production of the irregularly shaped silica-based particles is more likely to be lowered. When the $SiO_2$ concentration is more than 10 mass %, micronuclei of silica are generated, the shape irregularity cannot be kept, and particle growth of the irregularly shaped silica-based particles tends to be non-uniform.

This step b may be performed by a method which involves adding the silicic acid solution while hydrothermally treating the irregularly shaped porous silica-based gel-including particles. According to this method, the silicic acid solution added causes oversaturation, and silica is deposited to grow the particles while further causing dissolution of some of the particles. However, the pores between the primary particles are preferentially filled because the neck portions between the primary particles have a higher deposition rate than they are dissolved.

The heating temperature is preferably in the range of 60° C. to 170° C. At a temperature of less than 60° C., the irregularly shaped porous silica-based gel-including particles are more likely to grow slowly, while at a temperature of more than 170° C., the irregularly shaped silica-based particles obtained are more likely to have a spherical shape. It is recommended that the heating temperature be more advantageously in the range of 60° C. to 100° C.

Further, the pH at the time of adding the silicic acid solution to the solution containing the irregularly shaped porous silica-based gel-including particles is preferably in the range of 9 to 12.5. At a pH of less than 9, the solubility of silica is low, whereby the oversaturation is considerably increased, the silicic acid solution added is not consumed for growth of the particles, and fine particles are easily formed. The negative potential is also lowered and the particles are therefore easily aggregated. Further, for lack of dissociation of hydroxyl groups, the reactivity with the primary particles is reduced and the neck portions are not sufficiently reinforced. At a pH of more than 12.5, dissolution of silica may be promoted.

The pH of the solution containing the irregularly shaped porous silica-based gel-including particles is adjusted as necessary in order that the pH falls within the above-mentioned range. The method of adjustment is not particularly limited and an alkaline substance is usually added for adjustment. Examples of such an alkaline substance include sodium hydroxide and water glass. It is recommended that the pH at the time of adding the silicic acid solution to the solution containing the irregularly shaped porous silica-based gel-including particles be advantageously in the range of 9.5 to 12.0.

The silicic acid solution is preferably added in such an amount that the $SiO_2$ molarity of the silicic acid solution is preferably 0.5 to 20 moles with respect to the $SiO_2$ molarity of the solution containing the irregularly shaped porous silica-based gel-including particles. This is because when the amount of added silicic acid solution is below the above-defined range, the strength between the primary particles cannot be sufficiently enhanced and a sufficiently thick coating silica layer is not obtained, and the strength of the particles is therefore more likely to be lowered. This is also because when the particles are grown by adding the silicic acid solution or the like, the degree of shape irregularity and the aspect ratio are usually lowered but when the amount of added silicic acid solution exceeds the above-defined range, the degree of shape irregularity of the particles is considerably reduced and the particles are less likely to keep a desired degree of shape irregularity. Further, during particle growth, particles preferentially grow in a small particle component as compared with a large particle component, so that when the amount of added silicic acid solution exceeds the above-defined range, a small particle side component having a desired aspect ratio is less likely to be obtained.

The silicic acid solution is desirably added continuously or intermittently.

The silicic acid solution penetrates into the interiors of the particles through the pores between the primary particles in the irregularly shaped porous silica-based gel-including particles, and is deposited on the neck portions of the particles to reduce the specific surface area, thus enhancing the strength of the particles. In this step b, the irregularly shaped porous silica-based gel-including particles preferably have a specific surface area of 100 $m^2/g$ or less, and more preferably 15 $m^2/g$ to 50 $m^2/g$. When the irregularly shaped porous silica-based gel-including particles have a specific surface area of more than 100 $m^2/g$, the resulting irregularly shaped silica-based particles lack in strength and are more likely to be broken to lower the polishing rate when used as abrasive grains.

The specific surface area of the irregularly shaped porous silica-based gel-including particles is measured by the BET method as will be described in "Measurement of specific surface area" in Examples to be referred to below.

The silicic acid solution added dropwise from outside is uniformly spread over the surface of the irregularly shaped porous silica-based gel from the liquid phase and is bound to the outer surfaces of the irregularly shaped porous silica-based gel-including particles to grow the particles in shape and irregularly shaped silica-based particles having a large particle size can be therefore obtained while keeping their irregular shape. After the particle growth, the irregularly shaped silica-based particles preferably have a particle size in terms of weight-average particle size of 100 to 600 nm.

The weight-average particle size of the irregularly shaped silica-based particles means a value obtained by the measurement using the same method as the above-mentioned method for the weight-average particle size ($D_1$) of the silica-based particle group.

<Step C>

This step is a step which involves concentrating the silica-based particle group including the irregularly shaped silica-based particles having grown and collecting the concentrated silica-based particle group. Specifically, for instance, a step which includes cooling the solution containing the irregularly shaped silica-based particles having grown to room temperature to about 40° C., concentrating the solution using an ultrafiltration membrane or the like, and collecting the silica-based particle group remaining after further concentration using an evaporator or the like can be used. Centrifugation may further be performed to remove coarse particles. From the viewpoint that coarse aggregates are less likely to be formed by drying, concentration is preferably concentration using the ultrafiltration membrane.

EXAMPLES

Examples of the invention are illustrated below together with Comparative Examples. In Examples and Comparative Examples, measurement of the specific surface area of the silica-based particle group, calculation of the particle size in terms of specific surface area ($D_2$), measurement of the weight-average particle size ($D_1$), measurement and calculation of the projected area equivalent particle size ($D_3$), calculation of the kurtosis and skewness in the volume-based particle size distribution, waveform separation of the volume-based particle size distribution, measurement of the volume in the volume-based particle size distribution, calculation of the aspect ratio of the small particle side component, calculation of the coefficient of variation, measurement and calculation of the average area ($S_1$) and the area ($S_2$) of a circle equivalent to the average peripheral length, measurement and calculation of the average pore size of the core internal pores in the irregularly shaped silica-based particles, measurement and calculation of the average thickness of the coating silica layer in the irregularly shaped silica-based particles, and the polishing test were performed as follows:

[Measurement of Specific Surface Area]

In Examples 1 to 4 and Comparative Examples 3 to 5, measurement and calculation of the specific surface area were performed by the BET method. Specifically, 50 ml of silica sol to be subjected to measurement was adjusted with nitric acid to a pH of 3.5, and dried at 110° C. for 16 hours by addition of 40 ml of 1-propanol to obtain a sample. The sample was pulverized in a mortar and thereafter burned in a muffle furnace at 500° C. for 1 hour to obtain a measurement sample. Then, a specific surface area meter (type Multisorb 12 manufactured by Yuasa Ionics Co., Ltd.) was used to calculate the specific surface area from the amount of adsorbed nitrogen by the BET single point process according to the nitrogen adsorption method (BET method).

In the specific surface area meter, a 0.5 g portion of the burned sample was placed in a measurement cell and subjected to degassing treatment at 300° C. for 20 minutes in a 30 vol % nitrogen/70 vol % helium gas mixture stream. Then, the sample was maintained at the liquid nitrogen temperature in the gas mixture stream to cause equilibrium adsorption of nitrogen onto the sample. Then, the temperature of the sample was gradually increased to room temperature while flowing the gas mixture, the amount of nitrogen detached during this process was detected, and the specific surface area of silica fine particles in the sample was calculated from a previously prepared calibration curve.

In Comparative Examples 1, 2 and 6 in which the porous silica-based gel was crushed (buildup was not performed), measurement and calculation of the specific surface area were performed by the titration method. Specifically, a sample corresponding to 1.5 g of $SiO_2$ was collected in a beaker and placed in a thermostatic reactor (25° C.) and pure water was added to a liquid volume of 90 ml (the following operation was performed in the thermostatic reactor held at 25° C.). Next, a 0.1 mol/L aqueous hydrochloric acid solution was added to adjust the pH to 3.6. Further, 30 g of sodium chloride was added and the mixture was diluted with 150 ml of pure water and stirred for 10 minutes. Then, a pH electrode was set and a 0.1 mol/L sodium hydroxide solution was added dropwise with stirring to adjust the pH to 4.0. Further, the sample adjusted to the pH of 4.0 was titrated with the 0.1 mol/L sodium hydroxide solution, the titer and the pH value were recorded at 4 or more points in the pH range of 8.7 to 9.3, and a calibration curve was prepared by setting the titer of the 0.1 mol/L sodium hydroxide solution as X and the pH value at the time of titration as Y. The consumed amount of the 0.1 mol/L sodium hydroxide solution required for 1.5 g of $SiO_2$ at a pH of 4.0 to 9.0 was determined from the specified expression, and this was used to determine the specific surface area according to the specified expression.

[Calculation of Particle Size in Terms of Specific Surface Area ($D_2$)]

The particle size in terms of specific surface area ($D_2$) was calculated from the expression $D_2=6000/(SA\times\rho)$ with the use of the specific surface area (SA) measured by the above-mentioned method and the particle density ($\rho=2.2$).

[Measurement of Weight-Average Particle Size ($D_1$)]

The silica-based particle dispersion was diluted with a 0.05 mass % aqueous sodium dodecyl sulfate solution to a solids concentration of 2 mass %, 0.1 ml of the diluted dispersion was injected through a syringe into a disc centrifuge particle size distribution meter (type: DC24000UHR manufactured by CPS Instruments Inc.) and the weight-average particle size ($D_1$) was measured in a 8-24 mass % sucrose density gradient solution under a condition of 18,000 rpm. A crushed porous silica-based gel (irregularly shaped porous silica-based gel-including particles) was also measured by the same method.

[Measurement and Calculation of Projected Area Equivalent Particle Size ($D_3$)]

Measurement and calculation of the projected area equivalent particle size ($D_3$) in the silica-based particle group were performed by the image analysis method. Specifically, surfaces of silica-based particles were first taken at any points using a scanning electron microscope (SEM) at a magnification of 3,000× at 15 visual fields, one visual field having an area of $1.1\times10^{-3}$ $mm^2$. Then, as for all silica fine particles contained in each image taken at each visual field, the projected area of each particle was measured by the image analysis method using an image analysis system, the particle size of a circular particle (diameter of a circle) corresponding to each measured area was calculated, and the number average particle size was taken as the projected area equivalent particle size ($D_3$).

[Calculation of Kurtosis and Skewness in Volume-Based Particle Size Distribution]

The volume-based particle size distribution was also measured by the above-mentioned method using the disc centrifuge particle size distribution meter. Then, the kurtosis and skewness were calculated using JMP Ver. 13.2 manufactured by SAS Institute Japan Ltd. with the use of the volume-based particle size distribution data obtained. When the frequency of a specified particle size takes a negative value in the volume-based particle size distribution, calculation was performed by setting the frequency to zero.

[Waveform Separation of Volume-Based Particle Size Distribution]

The above-mentioned measured data of the volume-based particle size distribution was analyzed using a peak analyzer with graphing/data analysis software Origin (made by OriginLab Corporation). First, the baseline and the peak type were set to 0 and Gaussian, respectively. The local maximum point in the particle size distribution was selected as the peak position and peak fitting was performed without weighting. The calculated peaks were checked to see if the conditions 1 and 2 described below were satisfied. When the conditions were not satisfied, peak fitting was repeated while shifting the peak position to arbitrary positions within the distribution range until the conditions 1 and 2 were satisfied. Then, when the corrected R squared value was 0.99 or less, a peak was added at an arbitrary position in the distribution range and peak fitting was repeated until the corrected R squared value was increased to 0.99 or more. The number of the separation peaks was taken as the number of peaks.

Condition 1: Each calculated peak does not have a larger value than in the original distribution.

Condition 2: Each calculated peak does not have a negative value.

[Measurement of Volume in Volume-Based Particle Size Distribution]

The total volume ($Q_1$) of the silica-based particle group in the volume-based particle size distribution, the volume ratios of respective components at separation peaks obtained as a result of waveform separation thereof, the ratio of the volume of the maximum particle component, and the volume ($Q_2$) of particles having a size of 0.7 μm or more were measured using the above-mentioned disc centrifuge particle size distribution meter.

[Calculation of Aspect Ratio of Small Particle Side Component]

As for the aspect ratio of the small particle side component, a scanning electron microscope (SEM) and an image analysis system were used to count the total number of particles in the silica-based particle group. The area of each particle was calculated, and the diameter of a circle having an area equivalent to the above area was determined and taken as the particle size. Then, the particles were arranged in order of increasing particle size obtained. Counting was performed from the smaller side and particles covering one-third of the number of particles were deemed to be included in the small particle side component. An average value of the aspect ratio (ratio of the major axis length to the minor axis length of the minimum inscribed square) was taken as the "aspect ratio of the small particle side component."

[Calculation of Coefficient of Variation]

As for the coefficient of variation of the volume ratios of respective components at separation peaks obtained as a result of waveform separation of the volume-based particle size distribution of the silica-based particle group, and the coefficient of variation of the particle size of the volume-based particle size distribution, the standard deviation and the mean value were calculated from the above-mentioned measured data of the volume-based particle size distribution, and the standard deviation was divided by the mean value to calculate the coefficient of variation. The coefficient of variation was expressed by percentage.

[Measurement and Calculation of Average Area ($S_1$) and Area ($S_2$) of Circle Equivalent to Average Peripheral Length]

Measurement of the average area ($S_1$) and the area ($S_2$) of a circle equivalent to the average peripheral length in the silica-based particle group were performed by the image analysis method. Specifically, surfaces of silica-based particles were first taken at any points using a scanning electron microscope (SEM) at a magnification of 3,000× at 15 visual fields, one visual field having an area of $1.1\times10^{-3}$ $mm^2$. Then, all silica fine particles contained in each image taken at each visual field were subjected to measurement of the area and the peripheral length by the image analysis method using the image analysis system; the average area ($S_1$) and the average peripheral length (simple average value) were calculated from each data of the area and the peripheral length obtained by the measurement, and the area ($S_2$) of a circle equivalent to the average peripheral length (circle having a circumference equal to the average peripheral length) was further calculated from the average peripheral length.

[Measurement and Calculation of Average Pore Size of Core Internal Pores and Average Thickness of Coating Silica Layer in Irregularly Shaped Silica-Based Particles]

Measurement and calculation of the average pore size of the core internal pores and the average thickness of the coating silica layer in the irregularly shaped silica-based particles were performed as follows: First, the irregularly shaped silica-based particles were observed by a transmission electron microscope (TEM) at a magnification of 200,000×; the maximum diameter of one particle was deemed as the major axis length and a point dividing the major axis length on the major axis into two halves was determined; two points of intersection of a line orthogonal to the major axis at the point with the periphery of the particle were determined; and the distance between the two points was taken as a minor axis length. Thicknesses of the coating silica layer on both sides of the major axis and the minor axis were determined and their simple average value was taken as the average thickness of the coating silica layer of one particle. The thickness of the silica layer of each of arbitrary 20 particles was determined in the same manner and the simple average value was taken as the average thickness of the coating silica layer of the irregularly shaped silica-based particles.

Further, the sizes of the pores present on the major axis and the minor axis were determined and their average was taken as the average pore size of one particle. The pore size was determined in the same manner in arbitrary 20 particles and the simple average value was taken as the average pore size of the irregularly shaped silica-based particles.

[Method of Size Measurement of Porous Silica-Based Gel]

Size measurement of the porous silica-based gel was performed using LA-950 manufactured by HORIBA, Ltd. under the following measurement conditions.

LA-950V2 version: 7.02; algorithm option: standard operation; refractive index of solid: 1.450; refractive index of solvent (pure water): 1.333; number of repetitions: 15; circulation speed of sample introducing bath: 5; stirring speed: 2.

A measurement sequence including the previous settings was used to make measurement. Then, a measurement sample in the form of a stock solution was introduced with a dropper into a sample feed inlet of the device. The measurement sample was introduced so that the transmittance (R) had a numerical value of 90%. After the numerical value of the transmittance (R) was stabilized, the measurement sample was exposed to ultrasonic irradiation for 5 minutes to measure the particle size.

[Method of Measuring Ratio of Irregularly Shaped Silica-Based Particles Contained in Silica-Based Particle Dispersion Containing Silica-Based Particle Group Including Irregularly Shaped Silica-Based Particles and Non-Irregularly Shaped Silica-Based Particles]

The aspect ratio (ratio of the major axis length to the minor axis length of the minimum inscribed square) was determined for each of arbitrary 100 particles on projection images obtained by imaging the silica-based particle dispersion at a magnification of 250,000× (or 500,000×) using an electron microscope (type S-5500 manufactured by Hitachi, Ltd.). Particles having an aspect ratio of 1.1 or more are irregularly shaped silica-based particles. The ratio of the irregularly shaped silica-based particles was determined from the number of particles having an aspect ratio of 1.1 or more and the number of measured particles (100).

The results are shown in Table 1.

[Polishing Test]

Substrate to be Polished

A nickel-plated aluminum substrate (nickel-plated substrate manufactured by Toyo Kohan Co., Ltd.) for use in hard disks was used as a substrate to be polished. The substrate is a doughnut-shaped substrate (outer diameter: 95 mm; inner diameter: 25 mm; thickness: 1.27 mm).

Polishing Test

A 9 mass % silica-based particle dispersion (344 g) was prepared. To the dispersion was added 5.65 g of a 31 mass % hydrogen peroxide solution. After that, the mixture was adjusted with 10 mass % nitric acid to a pH of 1.5 to prepare a polishing slurry.

The substrate to be polished was set on a polishing apparatus (NF300 manufactured by Nano Factor Co., Ltd.). A polishing pad (Bellatrix NO178 manufactured by FILWEL CO., LTD.) was used to polish the substrate to a depth of 1 μm at a substrate load of 0.05 MPa, a disk rotation speed of 50 rpm, and a head rotation speed of 50 rpm while supplying the polishing slurry at a rate of 40 g/min.

Polishing Rate

The polishing rate was calculated from the difference in weight of the substrate before and after polishing and the polishing time.

Stability of Polishing Rate

Polishing was repeated five times under the above-mentioned conditions to calculate the coefficient of variation (CV value) of the polishing rate.

Smoothness of Substrate

The polished substrate obtained by the polishing test was observed using an ultrafine defect visualizing macro inspection system (trade name: Maicro-Max VMX-3100 manufactured by Vision Psytec) under the following observation conditions: MME-250 W white light was adjusted to 10% and LA-180Me to 0%.

In this observation, when defects are present at the substrate surface due to scratches or the like, white light is diffusely reflected and portions of the defects are observed in white color. On the other hand, white light is specularly reflected at portions having no defect and the whole surface is observed in black color. Such an observation was performed to evaluate the area of defects occurring due to scratches (linear scratches) present at the substrate surface (area of portions of the substrate observed in white color) under the following criteria:

| Area of defects | Evaluation |
|---|---|
| Less than 3% | "Very small" |
| 3% or more but less than 20% | "Small" |
| 20% or more but less than 40% | "Large" |
| 40% or more | "Very large" |

Waviness

Measurement was performed at an arbitrary position where the polished doughnut-shaped aluminum substrate was divided into two halves on the outer edge side and the inner edge side. Measurement was performed at the opposite measurement position where the substrate was divided into two halves. An average value of these measurements was taken as the waviness measurement value. Measurement conditions are as follows:

Device: ZygoNewView7200

Lens: 2.5×

Zoom ratio: 1.0

Filter: 50 to 500 μm

Measurement area: 3.75 mm×2.81 mm

Example 1

Preparation of Purified Silica Hydrogel

Pure water was added to 462.5 g of sodium silicate to prepare an aqueous sodium silicate solution having a concentration of 24 mass % in terms of $SiO_2$. To the solution was added a 25 mass % sulfuric acid to a pH of 4.5 to thereby obtain a silica hydrogel-containing solution. The silica hydrogel solution was maintained at a temperature of 21° C. in a thermostatic bath and allowed to stand for 5.75 hours for aging. After that, the solution was washed with pure water until the sodium sulfate content reached 0.05 mass % with respect to $SiO_2$ contained in the silica hydrogel, thereby obtaining a purified silica hydrogel (porous silica-based gel). The purified silica hydrogel had an $SiO_2$ concentration of 5.0 mass %, a specific surface area of 600 $m^2/g$, and a size of 84 μm.

Preparation of Irregularly Shaped Porous Silica-Based Gel

<Dispersion (1) of Irregularly Shaped Porous Silica-Based Gel Fine Particles>

To a 2 L glass beaker was added 500 g of the purified silica hydrogel having the $SiO_2$ concentration of 5.0 mass %. To the silica hydrogel was added a 4.8 mass % aqueous sodium hydroxide solution to adjust the pH to 9.8. To the mixture was added 2,390 g of a zirconia medium having a diameter of 1.0 mm. The mixture was placed in a sand mill and crushed (first grinding) until the weight-average particle size reduced to 530 nm, thereby obtaining a dispersion (1) of irregularly shaped porous silica-based gel fine particles having an $SiO_2$ concentration of 4.0 mass %.

<Dispersion (2) of Irregularly Shaped Porous Silica-Based Gel Fine Particles>

Next, to the dispersion (1) of irregularly shaped silica porous silica-based gel fine particles was added 1,135 g of a glass medium having a diameter of 0.25 mm. The mixture was crushed (second grinding) until the weight-average particle size reduced to 248 nm, thereby obtaining 1,900 g of a dispersion (2) of irregularly shaped porous silica-based gel fine particles having an $SiO_2$ concentration of 3.5 mass %.

Preparation of Silica-Based Particle Group Including Irregularly Shaped Silica-Based Particles and Non-Irregularly Shaped Silica-Based Particles To the resulting dispersion (2) of irregularly shaped porous silica-based gel fine particles was added ion-exchanged water to obtain 2,716 g of a solution having an $SiO_2$ concentration of 2.76 mass %. Next, a 4.8 mass % aqueous sodium hydroxide solution and ion-exchanged water were added to obtain a solution adjusted to a pH of 10.7 and an $SiO_2$ concentration of 2.5 mass %. Then, the temperature was increased to 98° C. and kept at 98° C. for 30 minutes. Next, while the temperature was kept at 98° C., 5,573.1 g of a 4.6 mass % acidic silicic acid solution was added over 20 hours. Stirring was continued for one hour while further keeping the temperature at 98° C.

The mixed solution was cooled to room temperature and then concentrated to an $SiO_2$ concentration of 12 mass % using an ultrafiltration membrane (SIP-1013 manufactured by Asahi Kasei Corporation). The mixed solution was further concentrated to 30 mass % in a rotary evaporator to obtain a silica-based particle group including irregularly shaped silica-based particles and non-irregularly shaped silica-based particles. The resulting silica-based particle group had a weight-average particle size of 261 nm.

Example 2

Preparation of Irregularly Shaped Porous Silica-Based Gel

<Dispersion (3) of Irregularly Shaped Porous Silica-Based Gel Fine Particles>

To a 2 L glass beaker was added 500 g of the purified silica hydrogel having the $SiO_2$ concentration of 5.0 mass % which had been obtained in Example 1. To the silica hydrogel was added a 4.8 mass % aqueous sodium hydroxide solution to adjust the pH to 9.8. To the mixture was added 1,135 g of glass beads having a diameter of 0.5 mm. The mixture was crushed until the weight-average particle size reduced to 204 nm, thereby obtaining a dispersion (3) of irregularly shaped porous silica-based gel fine particles having an $SiO_2$ concentration of 4.0 mass %.

Preparation of Silica-Based Particle Group Including Irregularly Shaped Silica-Based Particles and Non-Irregularly Shaped Silica-Based Particles The resulting dispersion (3) of irregularly shaped porous silica-based gel fine particles was subjected to the same step as in Example 1 to prepare a silica-based particle group including irregularly shaped silica-based particles and non-irregularly shaped silica-based particles. The resulting silica-based particle group had a weight-average particle size of 217 nm.

Example 3

Preparation of Large Particle-Containing Silica-Based Particle Group Including Irregularly Shaped Silica-Based Particles and Non-Irregularly Shaped Silica-Based Particles To the dispersion (1) of irregularly shaped porous silica-based gel fine particles (weight-average particle size: 530 nm) obtained in Example 1 was added ion-exchanged water to obtain 2,716 g of a solution having an $SiO_2$ concentration of 2.76 mass %. Next, a 4.8 mass % aqueous sodium hydroxide solution and ion-exchanged water were added to obtain a solution adjusted to a pH of 10.7 and an $SiO_2$ concentration of 2.5 mass %. Then, the temperature was increased to 98° C. and kept at 98° C. for 30 minutes. Next, while the temperature was kept at 98° C., 5,573.1 g of a 4.6 mass % acidic silicic acid solution was added over 20 hours. Stirring was continued for one hour while further keeping the temperature at 98° C. The mixed solution was cooled to room temperature and then concentrated to an $SiO_2$ concentration of 12 mass % using an ultrafiltration membrane (SIP-1013 manufactured by Asahi Kasei Corporation). The mixed solution was further concentrated to 30 mass % in a rotary evaporator to obtain a large particle-containing silica-based particle group including irregularly shaped silica-based particles and non-irregularly shaped silica-based particles. The resulting silica-based particle group including irregularly shaped silica-based particles having a large particle size had a weight-average particle size of 536 nm.

Example 4

Preparation of Irregularly Shaped Porous Silica-Based Gel <Dispersion (4) of Irregularly Shaped Porous Silica-Based Gel Fine Particles>

To the dispersion (1) of irregularly shaped porous silica-based gel fine particles (weight-average particle size: 530 nm) obtained in Example 1 was added a 4.8 mass % aqueous sodium hydroxide solution to adjust the pH to 9.8. To the mixture was added a glass medium having a diameter of 0.25 mm, and the mixture was crushed until the weight-average particle size reduced to 145 nm, thereby obtaining a 3.0 mass % dispersion (4) of irregularly shaped porous silica-based gel fine particles.

Preparation of Silica-Based Particle Group Including Irregularly Shaped Silica-Based Particles and Non-Irregularly Shaped Silica-Based Particles The resulting dispersion (4) of irregularly shaped porous silica-based gel fine particles was subjected to the same step as in Example 1 to prepare a silica-based particle group including irregularly shaped silica-based particles and non-irregularly shaped silica-based particles. The resulting silica-based particle group had a weight-average particle size of 160 nm.

Example 5

Preparation of Irregularly Shaped Porous Silica-Based Gel <Dispersion (5) of Irregularly Shaped Porous Silica-Based Gel Fine Particles>

To the dispersion (1) of irregularly shaped porous silica-based gel fine particles (weight-average particle size: 530 nm) obtained in Example 1 was added a 4.8 mass % aqueous sodium hydroxide solution to adjust the pH to 10.0. To the mixture was added a glass medium having a diameter of 0.25 mm, and the mixture was crushed until the weight-average particle size reduced to 225 nm, thereby obtaining a 3.0 mass % dispersion (5) of irregularly shaped porous silica-based gel fine particles.

Preparation of Silica-Based Particle Group Including Irregularly Shaped Silica-Based Particles and Non-Irregularly Shaped Silica-Based Particles The resulting dispersion (5) of irregularly shaped porous silica-based gel fine particles was subjected to the same step as in Example 1 to prepare a silica-based particle group including irregularly shaped silica-based particles and non-irregularly shaped silica-based particles. The resulting silica-based particle group had a weight-average particle size of 203 nm.

Example 6

Preparation of Irregularly Shaped Porous Silica-Based Gel <Dispersion (6) of Irregularly Shaped Porous Silica-Based Gel Fine Particles>

To the dispersion (1) of irregularly shaped porous silica-based gel fine particles (weight-average particle size: 530 nm) obtained in Example 1 was added a 4.8 mass % aqueous sodium hydroxide solution to adjust the pH to 10.0. To the mixture was added a glass medium having a diameter of 0.25 mm, and the mixture was crushed until the weight-average particle size reduced to 167 nm, thereby obtaining a 3.0 mass % dispersion (6) of irregularly shaped porous silica-based gel fine particles.

Preparation of Silica-Based Particle Group Including Irregularly Shaped Silica-Based Particles and Non-Irregularly Shaped Silica-Based Particles The resulting dispersion (6) of irregularly shaped porous silica-based gel fine particles was subjected to the same step as in Example 1 to prepare a silica-based particle group including irregularly shaped silica-based particles and non-irregularly shaped silica-based particles. The resulting silica-based particle group had a weight-average particle size of 164 nm.

Comparative Example 1

The dispersion (2) of irregularly shaped porous silica-based gel fine particles before reaction with the silicic acid solution which had been obtained in Example 1 was concentrated using an ultrafiltration membrane (SIP-1013 manufactured by Asahi Kasei Corporation) to an $SiO_2$ concentration of 9 wt %. This was used as Comparative Example 1.

Comparative Example 2

The purified silica hydrogel having the $SiO_2$ concentration of 5.0 mass % which had been obtained in Example 1 was dried overnight in a drier at 100° C. After that, the silica hydrogel was crushed in an agate mortar and burned at 550° C. for 2 hours to obtain a silica-based gel having a specific surface area of 200 $m^2$/g. To the silica-based gel was added pure water to obtain a 9 mass % silica-based gel dispersion. This was used as Comparative Example 2.

Comparative Example 3

Cataloid SI-80P (manufactured by JGC Catalysts and Chemicals Ltd.; silica concentration: 40 mass %) which was a dispersion containing dispersed silica fine particles was used as Comparative Example 3.

Comparative Example 4

SS-160 (manufactured by JGC Catalysts and Chemicals Ltd.; silica concentration: 20 mass %) which was a dispersion containing dispersed silica fine particles was used as Comparative Example 4.

Comparative Example 5

SS-300 (manufactured by JGC Catalysts and Chemicals Ltd.; silica concentration: 20 mass %) which was a dispersion containing dispersed silica fine particles was used as Comparative Example 5.

Comparative Example 6

To a 2 L glass beaker was added the purified silica hydrogel having the $SiO_2$ concentration of 5.0 mass % which had been obtained in Example 1. To the silica hydrogel was added a 4.8 mass % aqueous sodium hydroxide solution to adjust the pH to 9.8. To the mixture was added 2,390 g of a zirconia medium having a diameter of 1.0 mm. The mixture was placed in a sand mill and crushed until the average particle size reduced to 664 nm. The resulting dispersion of silica hydrogel fine particles had an $SiO_2$ concentration of 4.0 mass %. The dispersion of silica hydrogel fine particles was concentrated using an ultrafiltration membrane to an $SiO_2$ concentration of 9 mass % to thereby obtain a dispersion (5) of silica hydrogel fine particles. This was used as Comparative Example 6.

The above-mentioned measurement data and calculation data in Examples 1 to 4 and Comparative Examples 1 to 6 were shown in Table 1 and Table 2. Each of the silica-based particle groups in Examples 1 to 4 obtained by the specified production methods has a particle size, a particle size distribution and a degree of shape irregularity suitable for use as an abrasive. Further, when used as the polishing abrasive grain dispersion, the silica-based particle dispersion containing each of the silica-based particle groups can achieve a high polishing rate and a high surface accuracy at the same time.

TABLE 1

| | UNIT | EXAMPLE 1 | 2 | 3 | 4 | 5 | 6 |
|---|---|---|---|---|---|---|---|
| WEIGHT-AVERAGE PATRICLE SIZE ($D_1$) | nm | 261 | 217 | 536 | 160 | 203 | 164 |
| PARTICLE SIZE IN TERMS OF SPECIFIC SURFACE AREA ($D_2$) | nm | 90.9 | 97.4 | 97.4 | 82.6 | 91 | 72 |
| KURTOSIS | | 1.87 | 0.14 | 4.67 | −0.76 | 0.68 | −0.92 |
| SKEWNESS | | 1.52 | 1.09 | 2.14 | 0.70 | 1.24 | 0.80 |
| DEGREE OF SHAPE IRREGULARITY ($D = D_1/D_3$) | | 1.3 | 1.2 | 1.4 | 1.2 | 2.1 | 2.4 |
| A PLURALITY OF PORES INSIDE CORE | | FORMED | FORMED | FORMED | FORMED | FORMED | FORMED |
| COATING SILICA LAYER | | FORMED | FORMED | FORMED | FORMED | FORMED | FORMED |
| AVERAGE THICKNESS OF COATING SILICA LAYER | nm | 35 | 34 | 34 | 35 | 34 | 35 |
| NUMBER OF SEPARATION PEAKS AFTER WAVEFORM SEPARATION OF VOLUME-BASED PARTICLE SIZE DISTRIBUTION | pcs | 7 | 5 | 8 | 3 | 5 | 4 |
| RATIO OF VOLUME OF MAXIMUM PARTICLE COMPONENT IN SEPARATION PEAKS OBTAINED AS A RESULT OF WAVEFORM SEPARATION OF VOLUME-BASED PARTICLE SIZE DISTRIBUTION | % | 58 | 64 | 63 | 73 | 53 | 44 |
| ASPECT RATIO OF SMALL PARTICLE SIDE COMPONENT IN NUMBER-BASED PARTICLE SIZE DISTRIBUTION OBTAINED BY SEM IMAGE ANALYSIS | | 1.38 | 1.32 | 1.42 | 1.16 | 1.06 | 1.17 |
| COEFFICIENT OF VARIATION OF PARTICLE SIZE OF VOLUME-BASED PARTICLE SIZE DISTRIBUTION | % | 169 | 62 | 183 | 55 | 89 | 67 |

TABLE 1-continued

| | | | | | | | |
|---|---|---|---|---|---|---|---|
| RATIO OF AREA ($S_2$) OF CIRCLE EQUIVALENT TO AVERAGE PERIPHERAL LENGTH ACCORDING TO IMAGE ANALYSIS TO AVERAGE AREA ($S_1$) ACCORDING TO IMAGE ANALYSIS METHOD ($S = S_2/S_1$) | | 2.01 | 2.28 | 3.98 | 1.60 | 1.61 | 1.10 |
| RATIO OF VOLUME ($Q_2$) OF PARTICLES HAVING SIZE OF 0.7 μm OR MORE TOTAL VOLUME ($Q_1$) IN VOLUME-BASED PARTICLE SIZE DISTRIBUTION | % | 0.124 | 0.04 | 1.03 | <0.001 | 0.7 | 0.3 |
| AVERAGE PORE SIZE | nm | 15 | 15 | 15 | 15 | 15 | 12 |
| RATIO OF PARTICLES HAVING ASPECT RATIO OF 1.1 OR MORE | % | 74 | 94 | 58 | 75 | 89 | 96 |

| | COMPARATIVE EXAMPLE | | | | | |
|---|---|---|---|---|---|---|
| | 1 | 2 | 3 | 4 | 5 | 6 |
| WEIGHT-AVERAGE PATRICLE SIZE ($D_1$) | 248 | 535 | 104 | 185 | 316 | 664 |
| PARTICLE SIZE IN TERMS OF SPECIFIC SURFACE AREA ($D_2$) | 4.7 | 13.6 | 82.6 | 143.5 | 247.9 | 5.1 |
| KURTOSIS | 0.55 | 0.54 | −0.32 | −0.20 | −0.60 | 3.80 |
| SKEWNESS | 1.09 | 1.11 | 0.74 | 0.62 | 0.36 | 20.66 |
| DEGREE OF SHAPE IRREGULARITY ($D = D_1/D_3$) | 1.3 | 1.7 | 1.0 | 1.0 | 1.0 | 1.8 |
| A PLURALITY OF PORES INSIDE CORE | FORMED | FORMED | FORMED | FORMED | FORMED | FORMED |
| COATING SILICA LAYER | UN-FORMED | UN-FORMED | — | — | — | UN-FORMED |
| AVERAGE THICKNESS OF COATING SILICA LAYER | NO OUTER LAYER | NO OUTER LAYER | NO OUTER LAYER | NO OUTER LAYER | NO OUTER LAYER | NO OUTER LAYER |
| NUMBER OF SEPARATION PEAKS AFTER WAVEFORM SEPARATION OF VOLUME-BASED PARTICLE SIZE DISTRIBUTION | 4 | | 2 | 2 | 1 | 8 |
| RATIO OF VOLUME OF MAXIMUM PARTICLE COMPONENT IN SEPARATION PEAKS OBTAINED AS A RESULT OF WAVEFORM SEPARATION OF VOLUME-BASED PARTICLE SIZE DISTRIBUTION | 78 | | 87 | 73 | | 71 |
| ASPECT RATIO OF SMALL PARTICLE SIDE COMPONENT IN NUMBER-BASED PARTICLE SIZE DISTRIBUTION OBTAINED BY SEM IMAGE ANALYSIS | 1.36 | — | 1.02 | 1.03 | 1.02 | 1.58 |
| COEFFICIENT OF VARIATION OF PARTICLE SIZE OF VOLUME-BASED PARTICLE SIZE DISTRIBUTION | 158 | — | 17 | 12 | 7 | 61 |
| RATIO OF AREA ($S_2$) OF CIRCLE EQUIVALENT TO AVERAGE PERIPHERAL LENGTH ACCORDING TO IMAGE ANALYSIS TO AVERAGE AREA ($S_1$) ACCORDING TO IMAGE ANALYSIS METHOD ($S = S_2/S_1$) | 2.20 | — | 1.08 | 1.07 | 1.07 | 4.77 |

TABLE 1-continued

| | | | | | | |
|---|---|---|---|---|---|---|
| RATIO OF VOLUME ($Q_2$) OF PARTICLES HAVING SIZE OF 0.7 μm OR MORE TOTAL VOLUME ($Q_1$) IN VOLUME-BASED PARTICLE SIZE DISTRIBUTION | 0.08 | — | 0 | 0 | 0 | 6.99 |
| AVERAGE PORE SIZE | 15 | 15 | — | — | — | 15 |
| RATIO OF PARTICLES HAVING ASPECT RATIO OF 1.1 OR MORE | 97 | 93 | 5 | 6 | 4 | 95 |

| | | EXAMPLE | | | | | | COMPARATIVE EXAMPLE | | | | | |
|---|---|---|---|---|---|---|---|---|---|---|---|---|---|
| | UNIT | 1 | 2 | 3 | 4 | 5 | 6 | 1 | 2 | 3 | 4 | 5 | 6 |
| SPECIFIC SURFACE AREA OF POROUS SILICA GEL TO BE INTRODUCED IN STEP a | $m^2/g$ | 600 | 600 | 600 | 600 | 600 | 600 | 600 | | | | | 600 |
| WEIGHT-AVERAGE PARTICLE SIZE OF POROUS GEL-INCLUDING PARTICLES AFTER CRUSHING IN STEP a | nm | 248 | 204 | 530 | 145 | 225 | 167 | 248 | | | | | 664 |
| SPECIFIC SURFACE ARE AFTER REACTION OF POROUS GEL-INCLUDING PARTICLES WITH SILICIC ACID IN STEP b | $m^2/g$ | 30 | 28 | 28 | 33 | 30 | 38 | — (NO REACTION) | | | | | — (NO REACTION) |
| WEIGHT-AVERAGE PARTICLE SIZE AFTER GROWTH OF POROUS GEL-INCLUDING PARTICLES IN STEP b | nm | 261 | 217 | 536 | 160 | 203 | 164 | — | | | | | — |
| pH DURING WET CRUSHING IN STEP a | | 9.8 | 9.8 | 9.8 | 9.8 | 10.0 | 10.0 | 9.8 | | | | | 9.8 |
| $SiO_2$ CONC. OF SOLUTION CONTAINING POROUS GEL-INCLUDING PARTICLES IN STEP b | mass % | 2.5 | 2.5 | 2.5 | 2.5 | 2.5 | 2.5 | — | | | | | — |
| TEMP. AFTER HEATING OF SOLUTION CONTAINING POROUS GEL-INCLUDING PARTICLES IN STEP b | ° C. | 98 | 98 | 98 | 98 | 98 | 98 | — | | | | | — |
| pH of SOLUTION CONTAINING POROUS GEL-INCLUDING PARTICLES IN STEP b | | 10.7 | 10.7 | 10.7 | 10.7 | 10.7 | 10.7 | — | | | | | — |
| $SiO_2$ MOLARITY OF SILICIC ACID SOLUTION TO BE ADDED WITH RESPECT TO $SiO_2$ MOLARITY OF SOLUTION CONTAINING IRREGULARLY SHAPED POROUS GEL-INCLUDING PARTICLES IN STEP b | mol | 3.3 | 3.3 | 3.3 | 3.3 | 3.3 | 3.3 | — | | | | | — |
| POLISHING RATE | nm/min | 520 | 413 | 826 | 467 | 489 | 702 | 41 | 56 | 145 | 130 | 56 | 68 |
| COEFFICIENT OF VARIATION OF POLISHING RATE | % | 0.8 | — | — | — | — | — | — | — | — | — | — | 10 |
| WAVINESS | nm | 0.23 | — | — | 0.22 | 0.18 | 0.23 | — | 0.44 | 0.19 | — | — | 0.49 |
| AREA OF DEFECTS OF SUBSTRATE | | SMALL | — | — | SMALL | — | — | — | VERY LARGE | VERY SMALL | — | — | VERY LARGE |

INDUSTRIAL APPLICABILITY

The silica-based particle group according to the invention has suitable particle size, particle size distribution, degree of shape irregularity and particle strength, so that the silica-based particle dispersion containing the silica-based particle group can be preferably used in surface polishing of an NiP-plated substrate to be polished and a silica-based substrate.

This application claims priority based on Japanese Patent Application No. 2018-192147 filed on Oct. 10, 2018, the disclosure of which is incorporated herein by reference.

The invention claimed is:

1. A silica-based particle dispersion comprising a silica-based particle group including irregularly shaped silica-based particles and non-irregularly shaped silica-based particles, each of the irregularly shaped silica-based particles having a core including a plurality of pores in its interior and a coating silica layer covering the core, the silica-based particle group satisfying [1] to [3] described below:

[1] a weight-average particle size ($D_1$) is 100 to 600 nm, and a particle size in terms of specific surface area ($D_2$) is 30 to 300 nm;

[2] a degree of shape irregularity D ($D=D_1/D_3$) as expressed by a ratio of the weight-average particle size ($D_1$) to a projected area equivalent particle size ($D_3$) is 1.1 to 5.0; and

[3] a multi-peak distribution in which three or more separation peaks are detected is obtained by waveform separation of a volume-based particle size distribution.

2. The silica-based particle dispersion according to claim 1, wherein internal pores of the core have an average pore size of 20 nm or less.

3. The silica-based particle dispersion according to claim 1, wherein the coating silica layer has an average thickness of 1 to 50 nm and contains silica as its main component.

4. The silica-based particle dispersion according to claim 1, wherein the silica-based particle group has a skewness of −20 to 20 in the volume-based particle size distribution.

5. The silica-based particle dispersion according to claim 1, wherein a ratio of a volume of a maximum particle component in separation peaks obtained as a result of the waveform separation of the volume-based particle size distribution of the silica-based particle group is 75% or less.

6. The silica-based particle dispersion according to claim 1, wherein an aspect ratio of a small particle side component in a number-based particle size distribution obtained by SEM image analysis of the silica-based particle group is 1.05 to 5.0.

7. The silica-based particle dispersion according to claim 1, wherein a coefficient of variation of a particle size in the volume-based particle size distribution of the silica-based particle group is 30% or more.

8. The silica-based particle dispersion according to claim 1, wherein a smoothness S ($S=S_2/S_1$) in the silica-based particle group as expressed by a ratio of an area ($S_2$) of a circle equivalent to an average peripheral length according to an image analysis method to an average area ($S_1$) according to the image analysis method is 1.1 to 5.0.

9. The silica-based particle dispersion according to claim 1, wherein in the volume-based particle size distribution of the silica-based particle group, a ratio Q ($Q=Q_2/Q_1$) of a volume ($Q_2$) of particles having a size of 0.7 μm or more to a total volume ($Q_1$) is 1.2% or less.

10. A polishing abrasive grain dispersion comprising the silica-based particle dispersion according to claim 1.

11. A silica-based particle group including irregularly shaped silica-based particles and non-irregularly shaped silica-based particles, each of the irregularly shaped silica-based particles having a core including a plurality of pores in its interior and a coating silica layer covering the core, the silica-based particle group satisfying [1] to [3] described below:

[1] a weight-average particle size ($D_1$) is 100 to 600 nm, and a particle size in terms of specific surface area ($D_2$) is 30 to 300 nm;

[2] a degree of shape irregularity D ($D=D_1/D_3$) as expressed by a ratio of the weight-average particle size ($D_1$) to a projected area equivalent particle size ($D_3$) is 1.1 to 5.0; and

[3] a multi-peak distribution in which three or more separation peaks are detected is obtained by waveform separation of a volume-based particle size distribution.

12. A method of producing a silica-based particle group including irregularly shaped silica-based particles and non-irregularly shaped silica-based particles according to claim 11, the method comprising steps a to c:

(step a) a step which includes subjecting a porous silica-based gel to wet crushing in an alkaline state to obtain a solution containing irregularly shaped porous silica-based gel-including particles;

(step b) a step which includes adding a silicic acid solution to the solution containing the irregularly shaped porous silica-based gel-including particles in the alkaline state and heating the solution to cause the particles to grow with their shape remaining irregular while filling pores between primary particles in the irregularly shaped porous silica-based gel-including particles by a reaction with silicic acid contained in the silicic acid solution, thereby obtaining the irregularly shaped silica-based particles; and (step c) a step which includes concentrating the silica-based particle group including the irregularly shaped silica-based particles having grown and collecting the concentrated silica-based particle group.

13. The method of producing the silica-based particle group including the irregularly shaped silica-based particles and the non-irregularly shaped silica-based particles according to claim 12, wherein in the step a, the porous silica-based gel having a specific surface area of 300 to 800 $m^2/g$ is formed into the irregularly shaped porous silica-based gel-including particles having a weight-average particle size of 80 to 550 nm; and wherein in the step b, the pores between the primary particles in the irregularly shaped porous silica-based gel-including particles are filled by the reaction with the silicic acid to adjust a specific surface area of the irregularly shaped porous silica-based gel-including particles to 100 $m^2/g$ or less, and to cause the irregularly shaped silica-based particles to grow to have a weight-average particle size of 100 to 600 nm.

14. The method of producing the silica-based particle group including the irregularly shaped silica-based particles and the non-irregularly shaped silica-based particles according to claim 12, wherein in the step a, the porous silica-based gel is subjected to the wet crushing in the alkaline state of pH 8.0 to 11.5 to obtain the solution containing the irregularly shaped porous silica-based gel-including particles;

wherein in the step b, the solution containing the irregularly shaped porous silica-based gel-including particles is adjusted to an $SiO_2$ concentration of 1 to 10 mass % and heated to a temperature of 60° C. to 170° C., the silicic acid solution is continuously or intermittently added in the alkaline state of pH 9 to 12.5 to fill the pores between the primary particles in the irregularly shaped porous silica-based gel-including particles by the reaction with the silicic acid to reduce the specific surface area of the particles, while causing the particles to grow with their shape remaining irregular; and wherein in the step c, the solution containing the irregularly shaped silica-based particles having grown is concentrated and the silica-based particle group including the irregularly shaped silica-based particles is collected.

15. The method of producing the silica-based particle group including the irregularly shaped silica-based particles and the non-irregularly shaped silica-based particles according to claim 12, wherein in the step b, an $SiO_2$ molarity of the silicic acid solution is 0.5 to 20 moles with respect to an $SiO_2$ molarity of the solution containing the irregularly shaped porous silica-based gel-including particles.

* * * * *